US012563975B2

(12) United States Patent
Wang et al.

(10) Patent No.: US 12,563,975 B2
(45) Date of Patent: Feb. 24, 2026

(54) MAGNETIC MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Hung-Cho Wang, Hsinchu (TW); Sheng-Huang Huang, Hsinchu (TW); Yuan-Jen Lee, Hsinchu (TW); Jiunyu Tsai, Hsinchu (TW); Keng-Ming Kuo, Hsinchu (TW); Jun-Yao Chen, Hsinchu (TW); Harry-Hak-Lay Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 921 days.

(21) Appl. No.: 17/726,981

(22) Filed: Apr. 22, 2022

(65) Prior Publication Data

US 2023/0345842 A1     Oct. 26, 2023

(51) Int. Cl.
| | |
|---|---|
| *H10N 50/80* | (2023.01) |
| *H10N 50/01* | (2023.01) |
| *H10N 50/85* | (2023.01) |

(52) U.S. Cl.
CPC ............. *H10N 50/80* (2023.02); *H10N 50/01* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 2013/0154034 A1* | 6/2013 | Apalkov ................ | H10N 50/10 257/E29.323 |
| 2014/0374860 A1* | 12/2014 | Suzuki ................... | H10B 61/22 257/422 |
| 2023/0067715 A1* | 3/2023 | Yuh ..................... | H10D 30/6729 |
| 2023/0240150 A1* | 7/2023 | Chen ................... | H01F 10/3286 |

* cited by examiner

*Primary Examiner* — Michelle Mandala
(74) *Attorney, Agent, or Firm* — Birch, Stewart, Kolasch & Birch, LLP

(57) ABSTRACT

A memory device includes a memory unit and a shielding element disposed on the memory unit. The memory unit includes a bottom electrode, a memory element disposed on the bottom electrode, and a top electrode disposed on the memory element. The shielding element is disposed on the memory unit to deviate an external magnetic field away from the memory element.

20 Claims, 15 Drawing Sheets

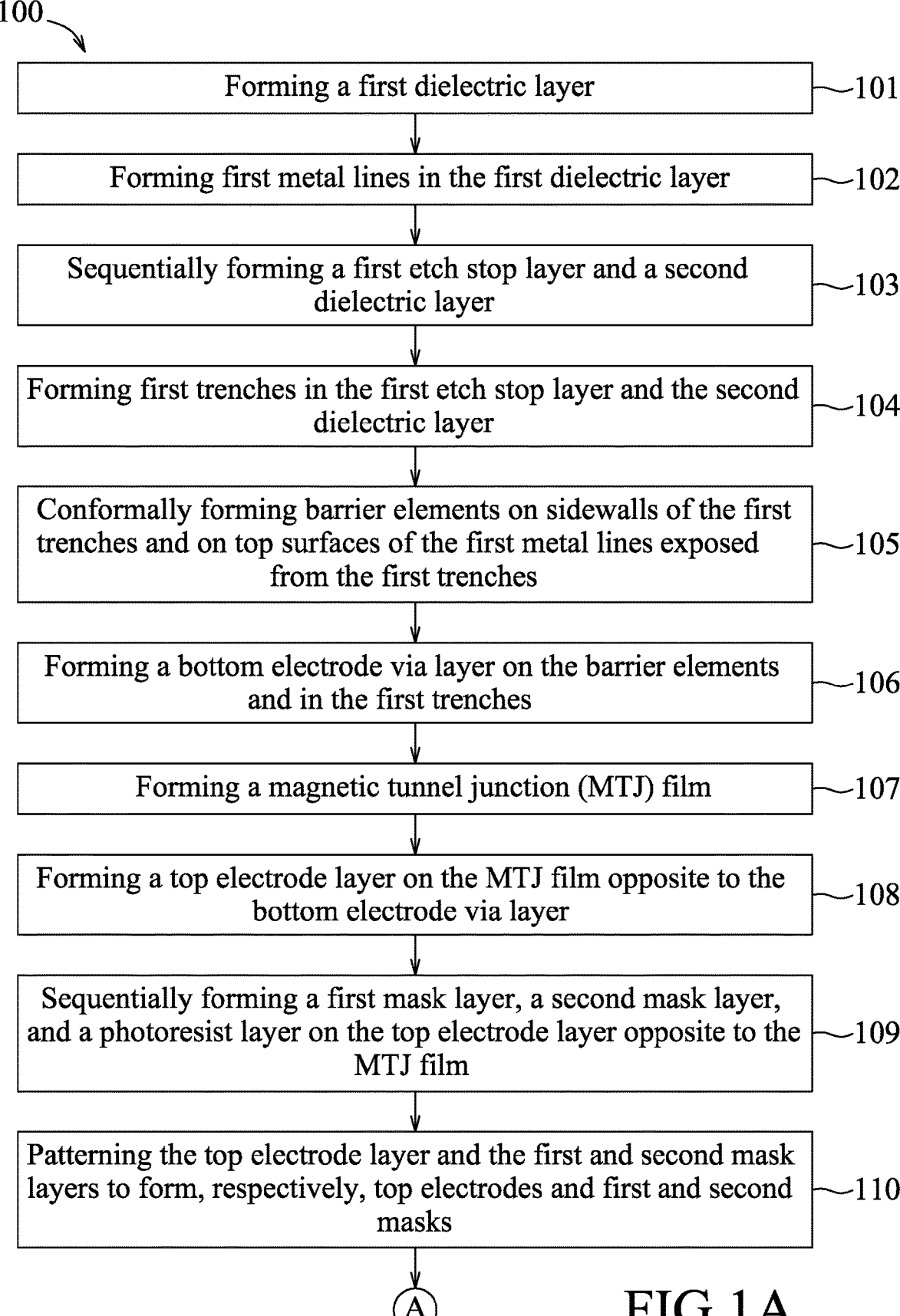

100

| | |
|---|---|
| Forming a first dielectric layer | 101 |
| Forming first metal lines in the first dielectric layer | 102 |
| Sequentially forming a first etch stop layer and a second dielectric layer | 103 |
| Forming first trenches in the first etch stop layer and the second dielectric layer | 104 |
| Conformally forming barrier elements on sidewalls of the first trenches and on top surfaces of the first metal lines exposed from the first trenches | 105 |
| Forming a bottom electrode via layer on the barrier elements and in the first trenches | 106 |
| Forming a magnetic tunnel junction (MTJ) film | 107 |
| Forming a top electrode layer on the MTJ film opposite to the bottom electrode via layer | 108 |
| Sequentially forming a first mask layer, a second mask layer, and a photoresist layer on the top electrode layer opposite to the MTJ film | 109 |
| Patterning the top electrode layer and the first and second mask layers to form, respectively, top electrodes and first and second masks | 110 |

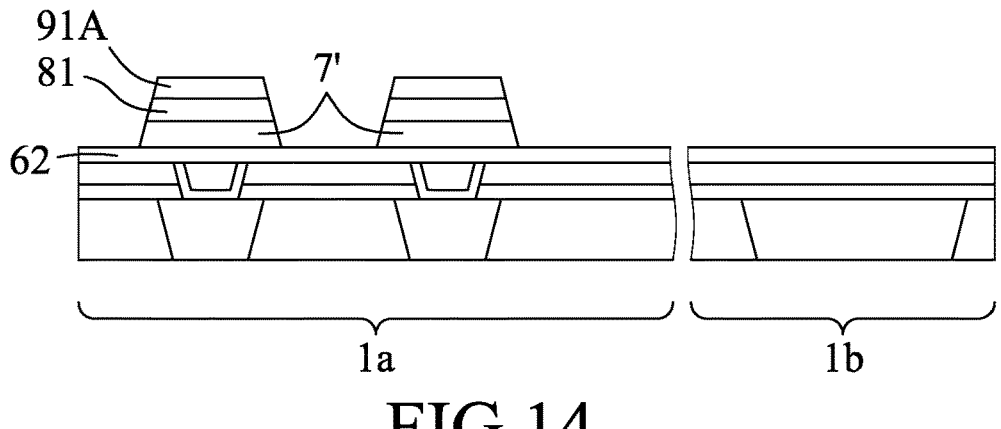
FIG.14
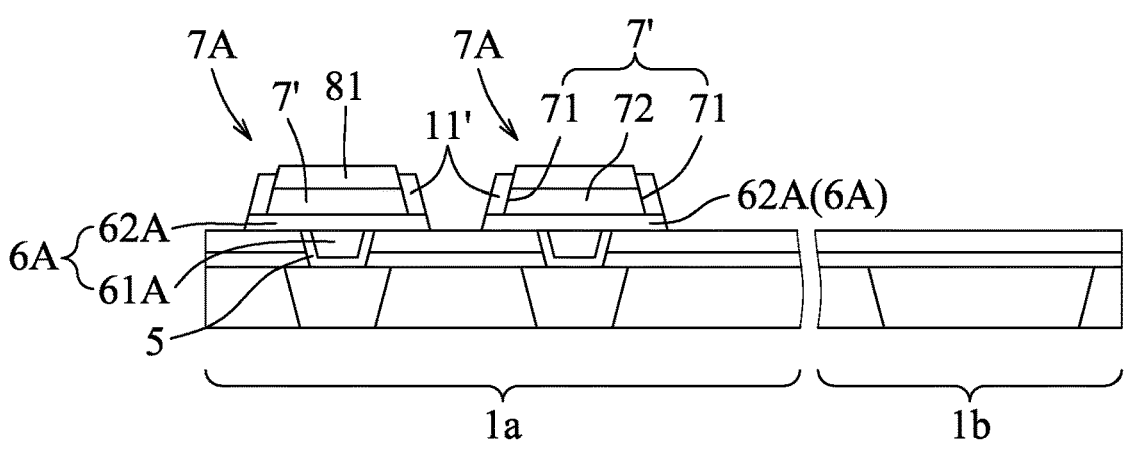
FIG.15
FIG.16

11'        7'

500                400                500

12'        7'

500                200                500

External magnetic field ($H_{ext}$)

MAGNETIC MEMORY DEVICE AND METHOD FOR MANUFACTURING THE SAME

BACKGROUND

Magnetic tunnel junction (MTJ) is a core component in several applications including read-heads of hard disk drives, sensors, and magneto-resistive random-access memory (MRAM). Among them, MRAM is an emerging non-volatile memory that is advantageous in terms of ultra-low power consumption and easy integration with logic circuit. Nevertheless, there is still a need to modify the structure of MRAM to improve electrical characteristics thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are flow diagrams illustrating a method for manufacturing a semiconductor structure in accordance with some embodiments of the present disclosure.

FIGS. 2 to 19 are schematic views illustrating intermediate stages of the method depicted in FIGS. 1A and 1B in accordance with some embodiments.

DETAILED DESCRIPTION

Figure 1B:
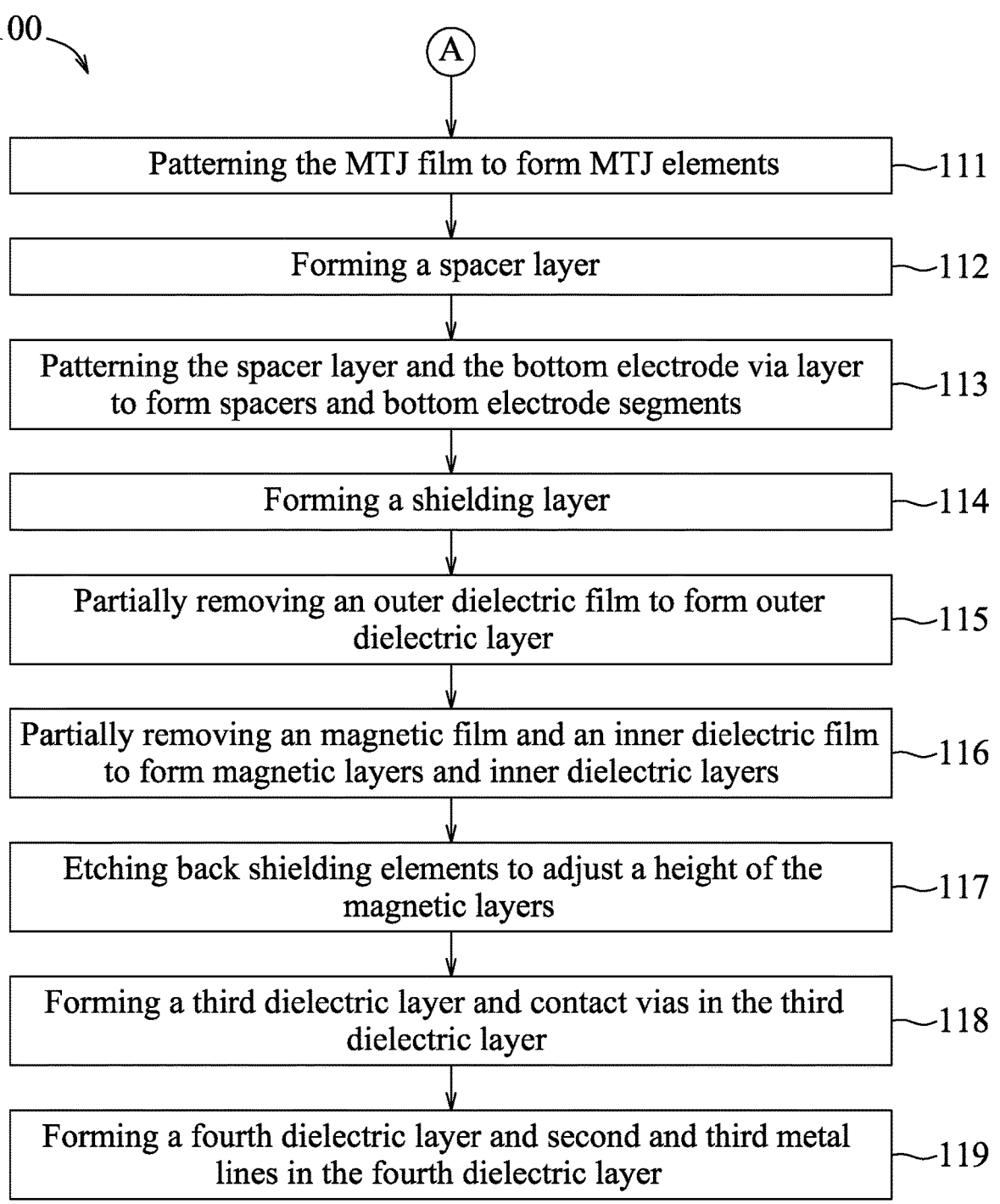

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "top," "bottom," "upper," "lower," "over," "under," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a magnetic memory device with enhanced protection against external magnetic field turbulence, and a method for manufacturing the same. The magnetic memory device includes a magnetic tunnel junction (MTJ) unit. The MTJ unit may be incorporated in various magnetic devices, such as magneto-resistive random-access memory (MRAM), sensor, biosensor, spin-transfer torque MRAM (STT-MRAM), spin-orbit torque MRAM (SOT-MRAM), or spintronic devices (e.g., spin-torque oscillator (STO) or microwave-assisted magnetic recording (MAMR)), but are not limited thereto. Other suitable applications for the MTJ unit are within the contemplated scope of disclosure. Furthermore, the dimension of the MTJ unit can be adjusted to permit the MTJ unit to be integrated in a variety of semiconductor technology nodes or generations.

FIGS. 1A and 1B are flow diagrams illustrating a method 100 for manufacturing a semiconductor structure (for example, a semiconductor structure 300 shown in FIG. 19) in accordance with some embodiments of the present disclosure. Specifically, the embodiments include a semiconductor structure located in the back-end-of-line (BEOL). The semiconductor structure 300 includes a magnetic memory device 200 in accordance with some embodiments of the present disclosure. FIGS. 2 to 19 illustrate schematic views of intermediate stages of the method 100. Some repeating structures are omitted in FIGS. 2 to 19, 22, and 23 for the sake of brevity. Additional steps can be provided before, after or during the method 100, and some of the steps described herein may be replaced by other steps or be eliminated. In some embodiments, the number of the magnetic memory device 200 can be varied according to the design for the memory size of the semiconductor structure 300. In some embodiments, the semiconductor structure 300 may include millions of the magnetic memory devices 200 that are arranged in rows and columns.

Figure 2:
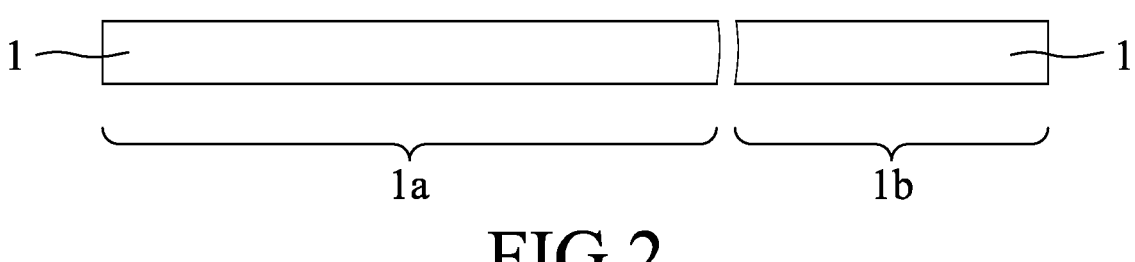

Referring to FIG. 1A and the example illustrated in FIG. 2, the method 100 begins at step 101, where a first dielectric layer 1 is formed. In some embodiments, the first dielectric layer 1 may be formed using, for example, chemical vapor deposition (CVD), physical vapor deposition (PVD), or other suitable deposition techniques. In some embodiments, the first dielectric layer 1 may include, but not limited to, silicon oxide, silicon nitride, silicon carbide, silicon oxycarbide, silicon oxynitride, silicon carbonitride, silicon oxycarbonitride, undoped silicate glass (USG), phosphosilicate glass (PSG), borosilicate glass (BSG), boron-doped phosphosilicate glass (BPSG), fluorine-doped silicate glass (FSG), porous carbon-doped silicon oxide, other suitable dielectric materials, or combinations thereof. In alternative embodiments, the first dielectric layer 1 may include, but not limited to, polyimide, epoxy resin, acrylic resin, phenol resin, benzocyclobutene (BCB), polybenzooxazole (PBO), other suitable polymer-based dielectric materials, or combinations thereof. The first dielectric layer 1 may include a low-k dielectric material (i.e., a dielectric material having a dielectric constant of lower than about 7). In some embodiments, the first dielectric layer 1 may include a device memory region 1*a* and a device peripheral region 1*b*. In certain embodiments, the device peripheral region 1*b* is a logic region. Other suitable materials and processes for forming the first dielectric layer 1 are within the contemplated scope of the present disclosure. In some embodiments, the first dielectric layer 1 may be an interlayer dielectric (ILD) layer.

Figure 3:
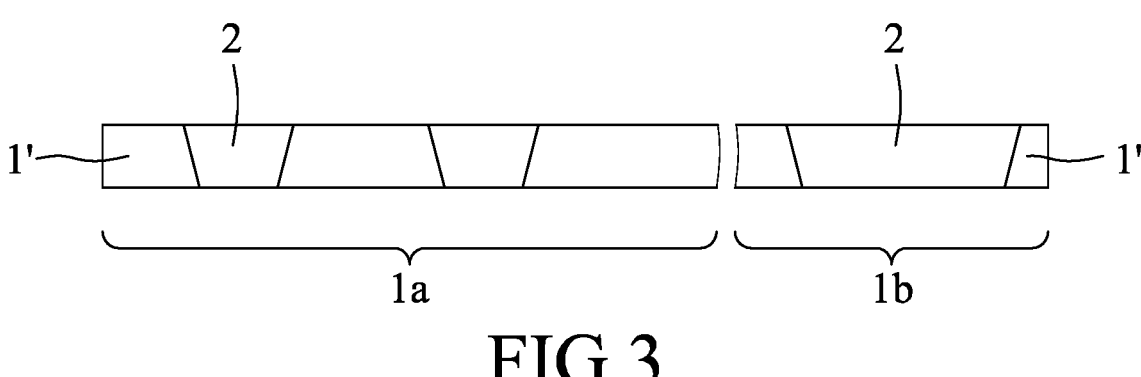

Referring to FIG. 1A and the example illustrated in FIG. 3, the method 100 proceeds to step 102, where first metal lines 2 are formed in the first dielectric layer 1. In some embodiments, step 102 includes the following sub-steps: (i) patterning the first dielectric layer 1 to form first recesses (not shown) in the first dielectric layer 1, thereby forming a patterned first dielectric layer 1', (ii) depositing a metallic material on the patterned first dielectric layer 1' to fill the first recesses, and (iii) removing an excess of the metallic material on the patterned first dielectric layer 1'. In some embodiments, the first dielectric layer 1 is patterned using photolithography and etching processes. The photolithography process may include several steps, for example, but not limited to, coating a photoresist, soft-baking, exposing the photoresist through a photomask, post-exposure baking, and developing the photoresist, followed by hard-baking so as to form a patterned photoresist. The etching process may be implemented by etching the first dielectric layer 1 through the patterned photoresist using, for example, dry etching, wet etching, a combination thereof, or other suitable etching techniques. Parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve patterning of the first dielectric layer 1 so as to form the patterned first dielectric layer 1'. Other suitable processes for patterning the first dielectric layer 1 are within the contemplated scope of the present disclosure. In some embodiments, the deposition of the metallic material for the first metal lines 2 may be implemented using, for example, CVD, PVD, electroless plating, electroplating, or other suitable deposition techniques. In some embodiments, the first metal lines 2 may include, but not limited to, copper, aluminum, tungsten, or combinations thereof. Other suitable materials for the first metal lines 2 are within the contemplated scope of the present disclosure. In some embodiments, the removal of excess metallic material may be implemented using, for example, chemical mechanical polishing (CMP), or other suitable planarization techniques. In some embodiments, each of the first metal lines 2 may be replaced by a contact via.

Figure 4:
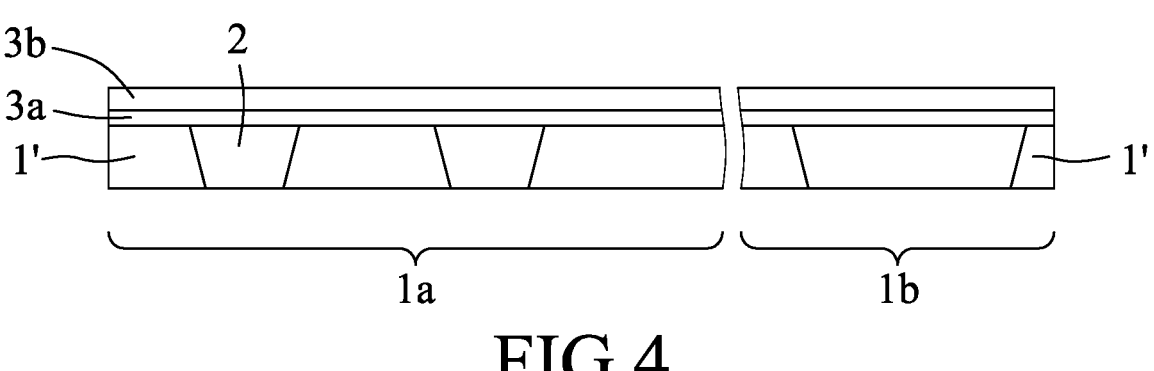

Referring to FIG. 1A and the example illustrated in FIG. 4, the method 100 proceeds to step 103, where a first etch stop layer 3*a* and a second dielectric layer 3*b* are sequentially formed on the patterned first dielectric layer 1' and the first metal lines 2. In some embodiments, the first etch stop layer 3*a* and the second dielectric layer 3*b* may be formed using, for example, CVD, plasma-enhanced chemical vapor deposition (PECVD), atomic layer deposition (ALD), spin-on coating, electroless plating, or other suitable deposition techniques. In some embodiments, the first etch stop layer 3*a* may include, but not limited to, metal nitride, metal oxide, metal carbide, silicon nitride, silicon oxide, silicon carbide, nitrogen-doped silicon carbide (NDC), silicon oxynitride, or combinations thereof, or the like. In some embodiments, the second dielectric layer 3*b* may include at least one of, but not limited to, a silicon-containing dielectric (e.g., silicon oxide, silicon-rich oxide), a nitrogen-containing dielectric (e.g., silicon nitride), an oxygen-containing dielectric (e.g., silicon oxynitride), a carbon-containing dielectric (e.g., silicon carbide), or the like. Other suitable materials for the first etch stop layer 3*a* and the second dielectric layer 3*b* are within the contemplated scope of the present disclosure. In some embodiments, after forming the first etch stop layer 3*a*, a top surface of the first etch stop layer 3*a* distal from the first metal lines 2 may be planarized using, for example, CMP, or other suitable planarization techniques. In some embodiments, after step 103, a top surface of the second dielectric layer 3*b* distal from the first etch stop layer 3*a* may be planarized using, for example, CMP, or other suitable planarization techniques.

Figure 5:
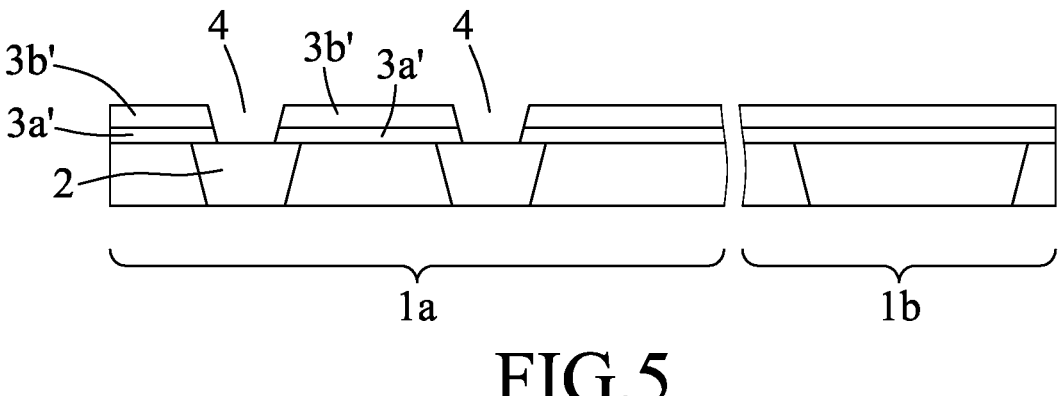

Referring to FIG. 1A and the example illustrated in FIG. 5, the method 100 proceeds to step 104, where first trenches 4 are formed in the first etch stop layer 3*a* and the second dielectric layer 3*b* on the device memory region 1*a* to expose the first metal lines 2 in the device memory region 1*a*, and to form the first etch stop layer 3*a* and the second dielectric layer 3*b* into etch stop sub-layers 3*a'* and second dielectric sub-layers 3*b'*, respectively. Step 104 may be implemented by patterning the first etch stop layer 3*a* and the second dielectric layer 3*b* by using a patterned photoresist layer (not shown) to form the first trenches 4. Each of the first trenches 4 may expose a corresponding one of the first metal lines 2. Each of the first trenches 4 is formed to have an upper edge bordering an opening distal from top surfaces of the first metal lines 2, a trench bottom on a corresponding one of the top surfaces of the first metal lines 2, and a sidewall connecting the upper edge and the trench bottom. The first trenches 4 may have slanted sidewalls (i.e., sidewalls not perpendicular to top surfaces of the first metal lines 2). The slanted sidewalls may be inclined in a way such that the opening of each of the first trenches 4 has a dimension larger than that of the trench bottom. The patterning process may be similar to those described above in step 102, but parameter(s) of the patterning process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve formation of the first trenches 4. The patterned photoresist layer may be removed after step 104. Other suitable techniques may be used for patterning the first etch stop layer 3*a* and the second dielectric layer 3*b*.

Figure 6:
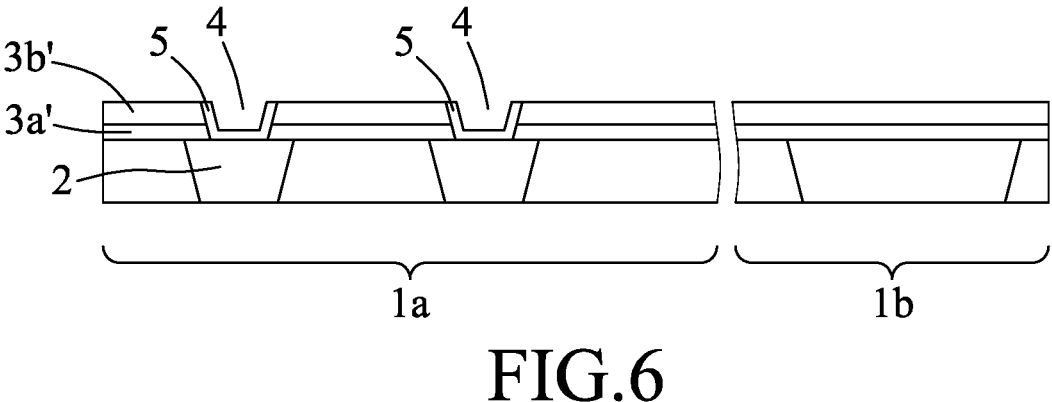

Referring to FIG. 1A and the example illustrated in FIG. 6, the method 100 proceeds to step 105, where barrier elements 5 are conformally formed on the sidewalls of the first trenches 4 and on the top surfaces of the first metal lines 2 exposed from the first trenches 4. The barrier elements 5 are in direct contact with the first metal lines 2 in the first trenches 4, respectively. In certain embodiments, the barrier elements 5 are additionally formed to cover top surfaces of the second dielectric sub-layers 3*b'*. In some embodiments, the barrier elements 5 may be formed by using, for example, CVD, metal organic chemical vapor deposition (MOCVD), PVD, ALD, or other suitable deposition techniques. In certain embodiments, step 105 may include the following sub-steps: (i) depositing a barrier layer on the sidewalls of the first trenches 4, the top surfaces of the first metal lines 2 exposed from the first trenches 4, and the top surfaces of the second dielectric sub-layers 3*b'*, and (ii) removing an excess portion of the barrier layer using, for example, CMP, or other suitable planarization techniques, to form the barrier elements 5. The excess portion of the barrier layer may be a part of the barrier layer on the top surfaces of the second dielectric sub-layers 3*b'*. In certain other embodiments, the excess portion of the barrier layer is not removed in step 105 but in a later step (for example, in step 106). Other suitable processes for forming the barrier elements 5 are within the contemplated scope of the present disclosure. In some embodiments, the barrier elements 5 may include, but not limited to, titanium, titanium nitride, tantalum, tantalum nitride, alloys thereof, combinations thereof, or the like. Other suitable materials for the barrier elements 5 are within the contemplated scope of the present disclosure.

Figure 7:
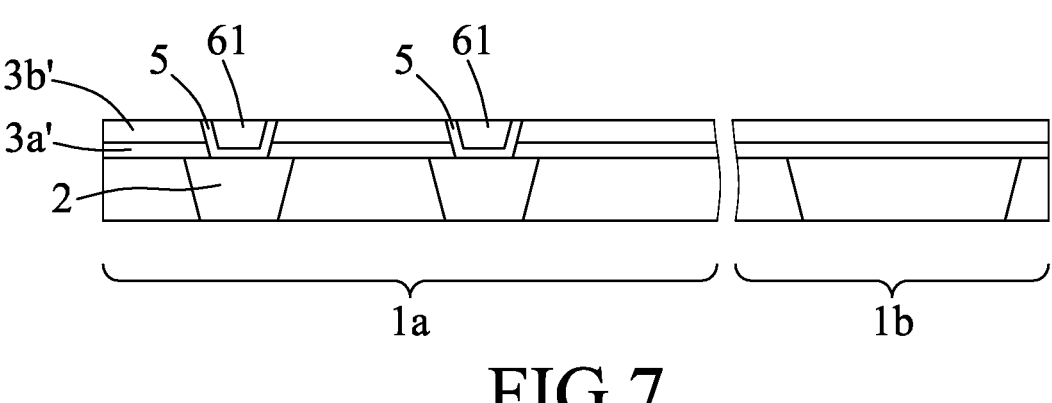
Figure 8:
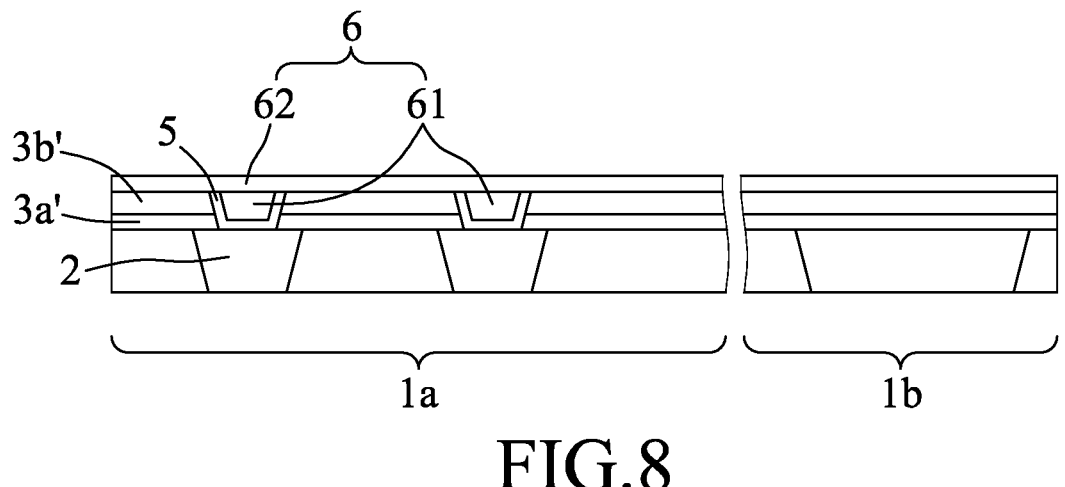

Referring to FIG. 1A and the examples illustrated in FIGS. 7 and 8, the method 100 proceeds to step 106, where a bottom electrode via layer 6 is formed on the barrier elements 5 and fills the first trenches 4 (see FIG. 6). In some embodiments, the bottom electrode via layer 6 may include, but not limited to, titanium nitride, tantalum, tantalum nitride, or combinations thereof. Other suitable materials for the bottom electrode via layer 6 are within the contemplated scope of the present disclosure. The bottom electrode via layer 6 is electrically connected to the first metal lines 2 through the barrier elements 5. In some embodiments, the bottom electrode via layer 6 and the barrier elements 5 are made of different materials. The bottom electrode via layer 6 includes filler portions 61 filling the first trenches 4, and a layer portion 62 disposed on the second dielectric sub-layers 3*b'* to cover the filler portions 61. In some embodiments, step 106 includes the following sub-steps: (i) depositing an electrode material layer over the structure shown in FIG. 6 using, for example, but not limited to, CVD, PVD, ALD, or other suitable deposition techniques, and (ii) planarizing the electrode material layer using, for example, CMP, or other suitable planarization techniques, to thereby obtain the filler portions 61 and the layer portion 62 of the bottom electrode via layer 6 shown in FIG. 8. In alternative embodiments, step 106 includes the following sub-steps: (i) depositing a first electrode material layer over the structure shown in FIG. 6 using, for example, but not limited to, CVD, PVD, ALD, or other suitable deposition techniques, (ii) removing an excess of the first electrode material layer using, for example, CMP, or other suitable planarization techniques, so as to form the first electrode material layer into the filler portions 61 (see FIG. 7), and (iii) further depositing a second electrode material layer, which serves as the layer portion 62 of the bottom electrode via layer 6, on the second dielectric sub-layers 3*b'* and the filler portions 61 (see FIG. 8). The filler portions 61 and the layer portion 62 may be made of the same material or different materials. In some embodiments, the layer portion 62 may have a thickness ranging from about 50 Å to about 500 Å, and is subjected to a planarization process. The planarization process may be a CMP process. After the planarization process, the layer portion 62 may have a thickness ranging from about 20 Å to about 150 Å.

Figure 18A:
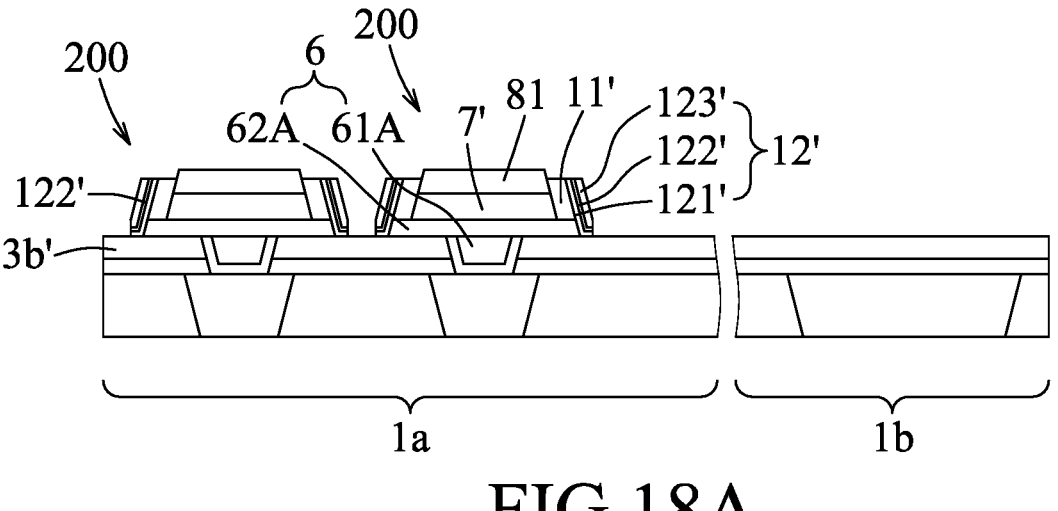
Figure 18B:
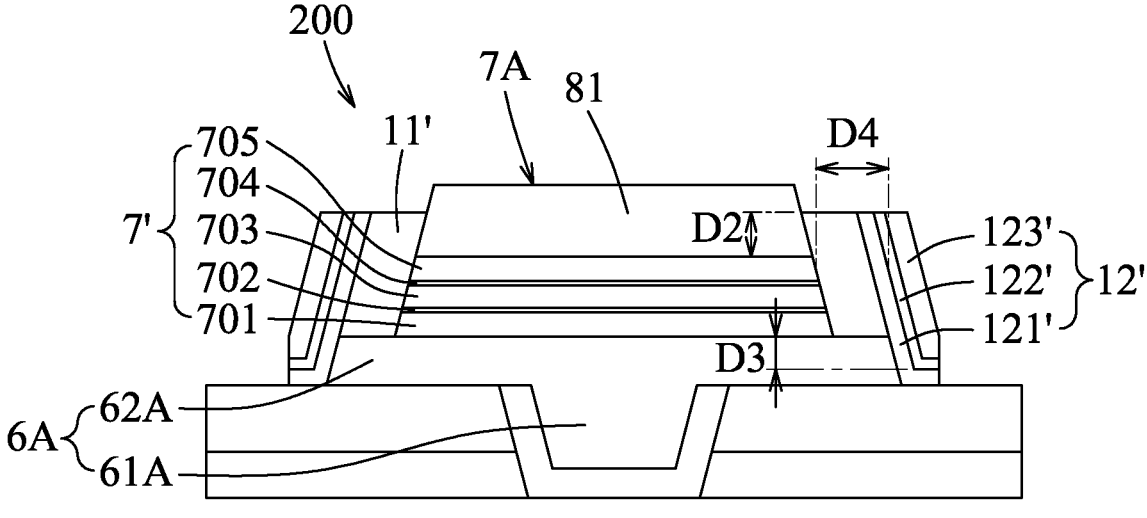

The provision of the barrier elements 5 may prevent diffusion of metal in the first metal lines 2 into bottom electrodes 62A which are shown in FIGS. 18A and 18B and which are formed thereafter by patterning the bottom electrode via layer 6. In the certain other embodiments (mentioned above in step 105), the excess portion of the barrier layer and the excess of the electrode material layer may be removed together to form one of the barrier elements 5 and a corresponding one of the filler portions 61 in each of the first trenches 4.

Figure 9:
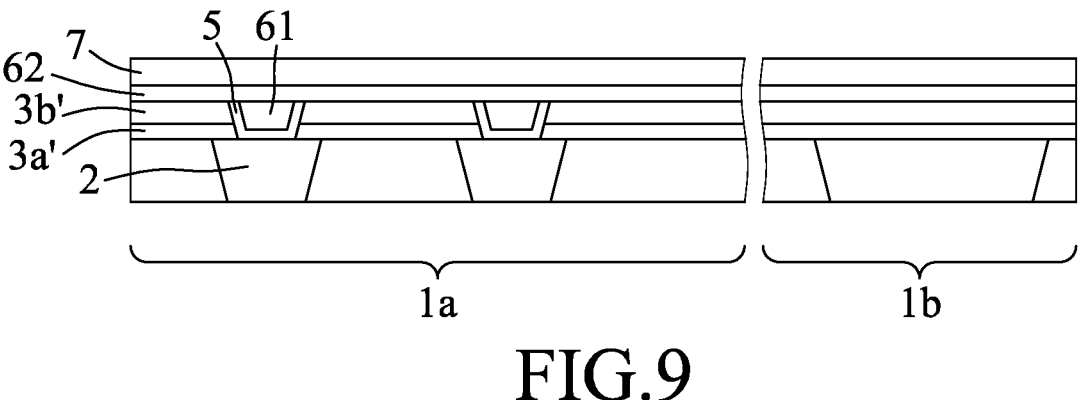

Referring to FIG. 1A and the example illustrated in FIG. 9, the method 100 proceeds to step 107, where a magnetic tunnel junction (MTJ) film 7 is formed on the bottom electrode via layer 6 opposite to the second dielectric sub-layers 3*b'*. In some embodiments, the MTJ film 7 may be formed using, for example, CVD, PVD, ALD, plasma-enhanced ALD, molecular beam epitaxy (MBE), or other suitable deposition techniques. In some embodiments, the MTJ film 7 has a thickness ranging from about 150 Å to about 250 Å. The MTJ film 7 is provided for making MTJ elements 7' shown in FIG. 18B each of which is switchable between a parallel (P) state or an antiparallel (AP) state due to a tunneling magneto-resistance (TMR) effect. A write voltage can be applied to switch each of the MTJ elements 7' to the P state or the AP state. In some embodiments, the MTJ film 7 may include, from bottom to top, a reference film (i.e., pin film) (not shown), a tunnel barrier film (not shown), a free film (not shown), a maintenance film (not shown), and a buffer film (not shown). In alternative embodiments, the MTJ film 7 includes, from bottom to top, the maintenance film, the free film, the tunnel barrier film, the reference film, and the buffer film. In some other embodiments, the maintenance film and a buffer film may be omitted. Other suitable configurations for the MTJ film 7 are within the contemplated scope of the present disclosure.

Figure 19:
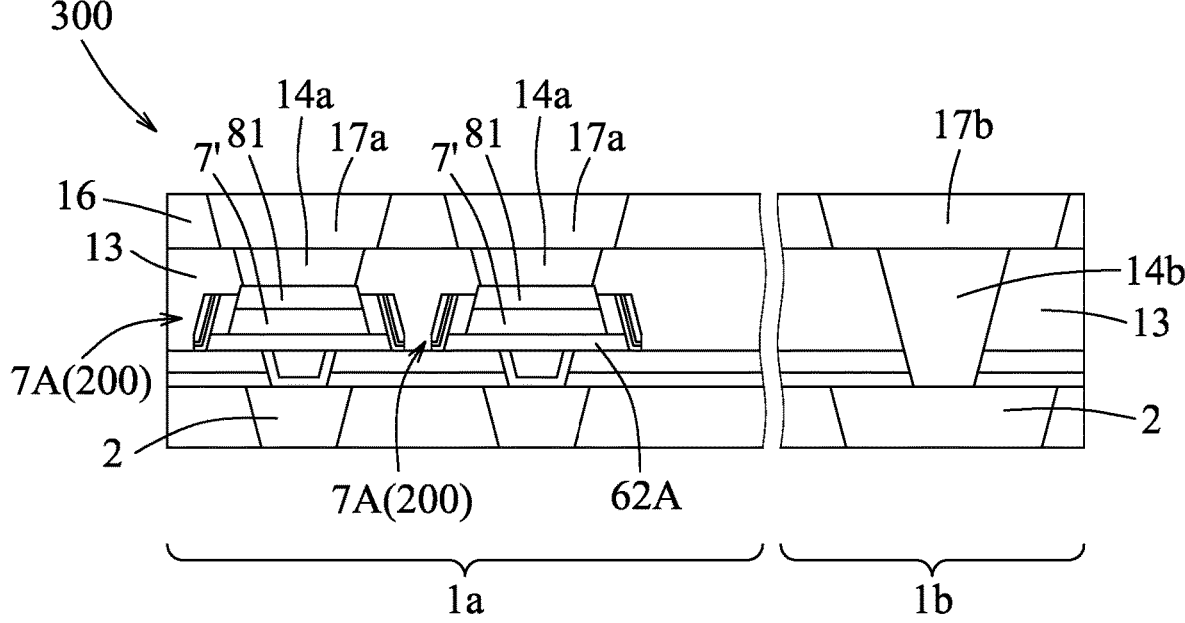

The reference film is provided to form a reference layer 701 of each of the MTJ elements 7' shown in FIGS. 18B and 19 which has a fixed magnetic orientation. In some embodiments, the reference film includes a first ferromagnetic material, such as cobalt (Co), iron (Fe), nickel (Ni), cobalt-iron alloy (CoFe), cobalt-iron-nickel alloy (CoFeNi), cobalt-boron alloy (CoB), iron-boron alloy (FeB), cobalt-iron-boron alloy (CoFeB), or combinations thereof. In some embodiments, the reference film may be formed as a single layer structure or a multi-layered structure, such as $(Co/X)_n$, where X may be Ni, platinum (Pt), palladium (Pd), etc., and n is a number of the layers in the multi-layered structure and is an integer greater than two. Other suitable materials for the reference film are within the contemplated scope of the present disclosure.

The free film is provided to form a free layer 703 of each of the MTJ elements 7' shown in FIGS. 18B and 19 which has a changeable magnetic orientation (e.g., parallel or antiparallel to the magnetic orientation of the reference film) so as to provide the P state or the AP state. In some embodiments, the free film includes a second ferromagnetic material, such as Fe, Co, Ni, CoFe, CoB, FeB, CoFeB, cobalt-iron-nickel-boron alloy (CoFeNiB), or combinations thereof. In some embodiments, the free film may be formed as a single layer structure or a multi-layered structure having alternately stacked ferromagnetic and non-magnetic sub-layers.

The tunnel barrier film includes a first insulating material, and is provided for making a tunnel barrier layer 702 of each of the MTJ elements 7' shown in FIGS. 18B and 19. The tunnel barrier layer 702 has a predetermined thickness to permit electrons to be tunneled therethrough so as to induce a spin dependent tunneling effect between the reference layer 701 and the free layer 703. In some embodiments, the first insulating material includes an oxide, a nitride, an oxynitride, or combinations thereof. In some embodiments, the first insulating material includes, for example, but is not limited to, magnesium oxide (MgO), aluminum oxide ($AlO_x$), silicon oxide ($SiO_x$), titanium oxide ($TiO_x$), tantalum oxide ($TaO_x$), chromium oxide ($CrO_x$), hafnium oxide ($HfO_x$), zinc oxide (ZnO), or combinations thereof. Other suitable materials for the tunnel barrier film are within the contemplated scope of the present disclosure. In some embodiments, the tunnel barrier film is made of MgO.

The maintenance film is provided for making a maintenance layer 704 of each of the MTJ elements 7' shown in FIGS. 18B and 19, and includes a second insulating material (for example, but not limited to, an oxide material such as MgO) so as to facilitate the free layer 54 of each of the MTJ elements 7' to be retained in the P state or the AP state when the MTJ elements 7' are in, for example, but not limited to, a relatively high temperature. Other suitable materials for the maintenance film are within the contemplated scope of the present disclosure.

The buffer film is provided for making a buffer layer 205 of each of the MTJ elements 7' shown in FIGS. 18B and 19, and may be used to protect the films therebeneath during subsequent processes. In some embodiments, the buffer film may include Ru, Ta, Mo, alloy thereof, or combinations thereof. Other suitable materials for the buffer film are within the contemplated scope of the present disclosure.

Figure 10:
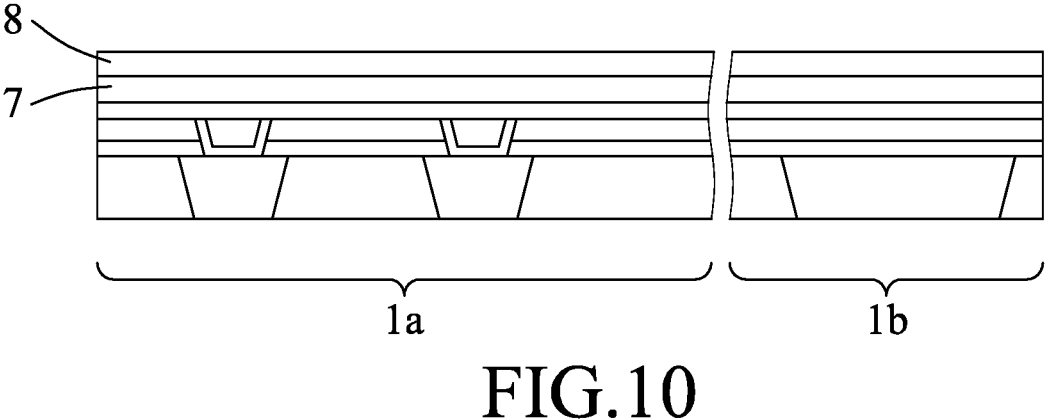

Referring to FIG. 1A and the example illustrated in FIG. 10, the method 100 proceeds to step 108, where a top electrode layer 8 is formed on the MTJ film 7 opposite to the bottom electrode via layer 6. In some embodiments, the top electrode layer 8 may be formed using, for example, CVD, PVD, ALD, or other suitable deposition techniques. In some embodiments, the top electrode layer 8 may include, but not limited to, titanium nitride, platinum, aluminum copper, gold, titanium, tantalum, tantalum nitride, tungsten, tungsten nitride, alloys thereof, or combinations thereof. Other suitable materials for the top electrode layer 8 are within the contemplated scope of the present disclosure. In some embodiments, the top electrode layer 8 may be constructed in a single-layer form. In alternative embodiments, the top electrode layer 8 may include a plurality of layers made of different materials.

Figure 11:
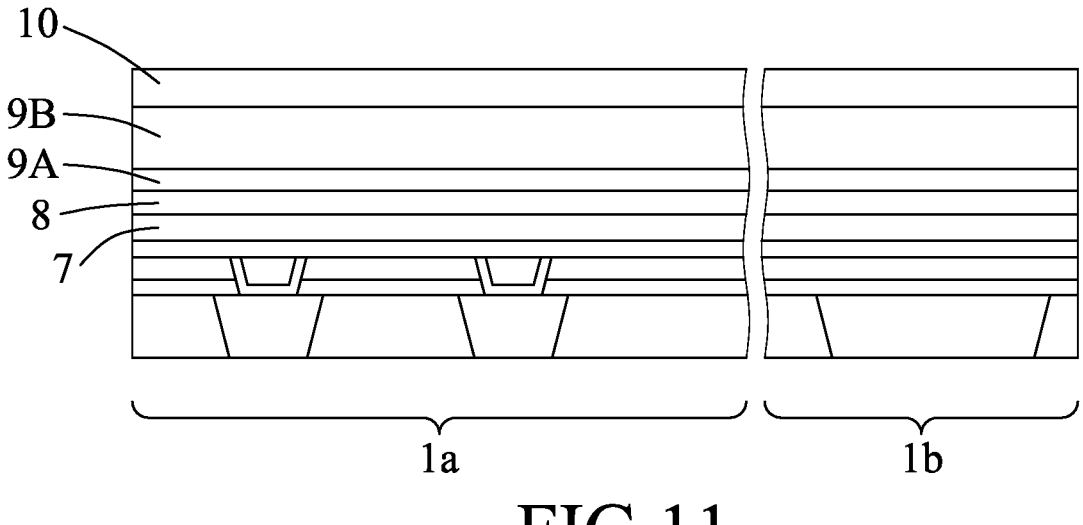

Referring to FIG. 1A and the example illustrated in FIG. 11, the method 100 proceeds to step 109, where a first mask layer 9A and a second mask layer 9B are sequentially formed on the top electrode layer 8 opposite to the MTJ film 7, followed by forming a photoresist layer 10 on the second mask layer 9B. In some embodiments, the first mask layer 9A may be formed using, for example, CVD, PVD, ALD, electroplating, electroless-plating, or other suitable deposition techniques. In some embodiments, the second mask layer 9B may be formed using, for example, CVD, PVD, ALD, or other suitable techniques. In some embodiments, the first and second mask layers 9A, 9B may be hard mask layers. The first mask layer 9A may include a metal, for example, but not limited to, tantalum, copper, or the like. The second mask layer 9B may be a dielectric material, and may include, but not limited to, titanium nitride, silicon oxide, silicon nitride, silicon carbide nitride, silicon oxynitride (SiO$_x$N$_y$), metal oxide (e.g., titanium oxide, aluminum oxide or the like), or combinations thereof. Other suitable materials for the first and second mask layers 9A, 9B are within the contemplated scope of the present disclosure. The photoresist layer 10 may be formed by spin coating, or other suitable techniques.

Figure 12:
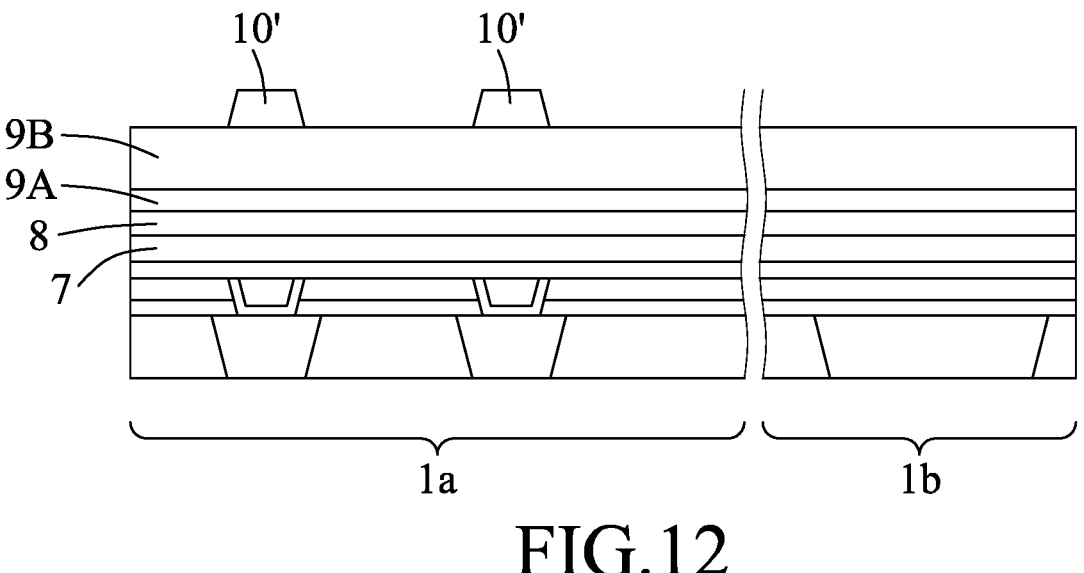

Referring to FIG. 1A and the examples illustrated in FIGS. 11 and 12, the method 100 proceeds to step 109, where the photoresist layer 10 is patterned to form photoresists 10' on the second hard mask layer 9B. Patterning of the photoresist layer 10 may be performed using a photomask or without a mask (e.g., ion-beam writing). Other suitable processes for patterning the photoresist layer 10 are within the contemplated scope of the present disclosure.

Figure 13:
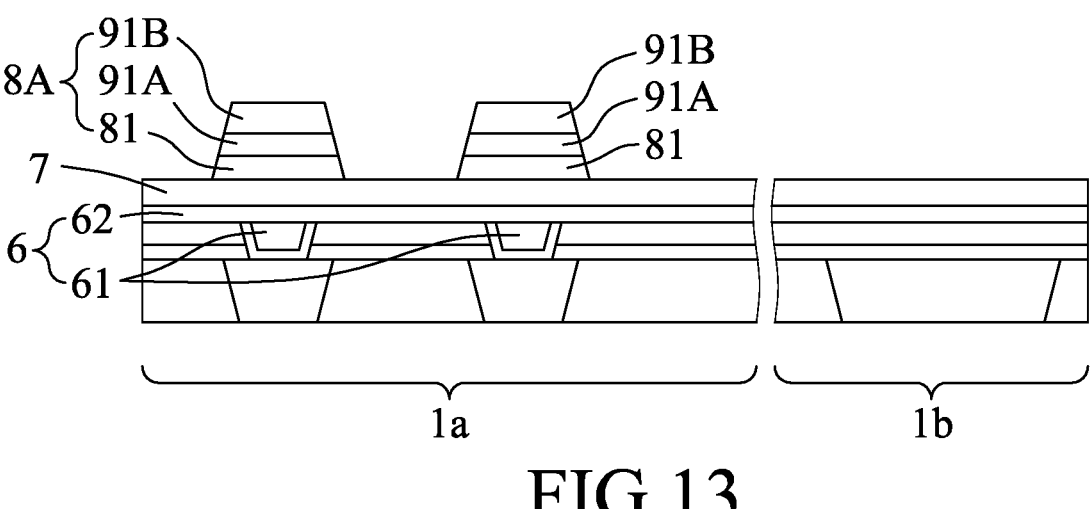

Referring to FIG. 1A and the example illustrated in FIG. 13, the method 100 proceeds to step 110, where the top electrode layer 8 and the first and second mask layers 9A, 9B shown in FIG. 12 are patterned to form, respectively, top electrodes 81 and first and second masks 91A, 91B on the device memory region 1a. In step 110, the photoresists 10' are used as an etch mask to pattern the top electrode layer 8 and the first and second mask layers 9A, 9B. Patterning of the top electrode layer 8 and the first and second mask layers 9A, 9B may include multiple etching processes so that the top electrodes 81 and the first and second masks 91A, 91B are formed according to application requirements. In some embodiments, the multiple etching processes may each be a reactive ion etch (RIE) processor ion beam etch (IBE) process, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve formation of the top electrode layer 8 and the first and second mask layers 9A, 9B. After step 110, a plurality of stacks 8A are formed in positions corresponding to the filler portions 61 of the bottom electrode via layer 6, respectively. Each of the stacks 8A includes one of the top electrodes 81, and corresponding ones of the first and second masks 91A, 91B formed thereon. In some embodiments, the photoresists 10' are used for patterning the second mask layer 9B to form the second masks 91B. Thereafter, the photoresists 10' shown in FIG. 12 may be removed by, for example, but not limited to, a stripping process. In addition, the second masks 91B are used for patterning the top electrode layer 8 and the first mask layer 9A to form the top electrodes 81 and the first and second masks 91A, 91B, and thereafter, the second masks 91B may be removed by, for example, but not limited to, an etching process. Other suitable processes for removing the photoresists 10' and the second masks 91B are within the contemplated scope of the present disclosure.

Referring to FIG. 1B and the example illustrated in FIG. 14, the method 100 proceeds to step 111, where the MTJ film 7 shown in FIG. 13 is patterned to form into MTJ elements 7' on the device memory region 1a. The MTJ film 7 may be patterned by using the stacks 8A as an etch mask (see FIG. 13). Patterning of the MTJ film 7 may include multiple etching processes so that the MTJ elements 7' are formed according to application requirements. The multiple etching processes may each be an RIE process, an ion beam etch (IBE) process, or other suitable processes, but parameter(s) of each etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve formation of the MTJ elements 7'. After step 111, the MTJ elements 7' are formed in positions corresponding to the filler portions 61 of the bottom electrode via layer 6, respectively.

Referring to FIG. 1B and the example illustrated in FIG. 15, the method 100 proceeds to step 112, where a spacer layer 11 is formed over the structure shown in FIG. 14 (covering the first masks 91A, the MTJ elements 7', and the bottom electrode via layer 6). The spacer layer 11 may be a single-layer structure or may include a plurality of layers made of different material. The spacer layer 11 may be formed by, for example, CVD, PVD, ALD, or other suitable deposition techniques. The spacer layer 11 may be deposited at a temperature ranging from room temperature (e.g., about 25° C.) to about 400° C. The spacer layer 11 may include a material of, for example, but not limited to, silicon nitride, silicon oxide, a multilayer oxide-nitride-oxide film, undoped silicate glass, or combinations thereof. Other suitable materials for the spacer layer 11 are within the contemplated scope of the present disclosure.

Referring to FIG. 1B and the example illustrated in FIG. 16, the method 100 proceeds to step 113, where the spacer layer 11 and the bottom electrode via layer 6 (see FIG. 15) are patterned. The spacer layer 11 is patterned to form a plurality of spacers 11' in the device memory region 1a. The spacer layer 11 is patterned such that each of the spacers 11' thus formed covers an outer periphery of a respective one of the MTJ elements 7'. The spacer layer 11 may be patterned by, for example, but not limited to, dry etching, wet etching, RIE, IBE, or combinations thereof. Other suitable processes for patterning the spacer layer 11 are within the contemplated scope of the present disclosure. In certain embodiments, the spacer layer 11 is patterned so that at least a part of the top electrodes 81 is exposed and that outer peripheries of the MTJ elements 7' remain covered by the spacers 11'. The bottom electrode via layer 6 exposed from the first masks 91A and the spacers 11' is patterned such that the bottom electrode via layer 6 shown in FIG. 15 is formed into bottom electrode segments 6A which are disposed on the device memory region 1a. After step 113, MTJ units 7A are formed, and each of the MTJ units 7A may include one of the barrier elements 5, a corresponding one of the bottom electrode segments 6A, a corresponding one of the MTJ elements 7', a corresponding one of the top electrodes 81, and a corresponding one of the spacers 11'. Each of the bottom electrode segments 6A includes a bottom electrode via 61A which corresponds to one of the filler portions 61, and a bottom electrode 62A which is formed on the bottom electrode via 61A. In some embodiments, the bottom electrode via layer 6 is patterned using, for example, dry etching, wet etching, RIE, IBE, combinations thereof, or other suitable etching techniques. Other suitable processes for patterning the bottom electrode via layer 6 are within the contemplated scope of the present disclosure. Parameter(s) of the etching process (e.g., concentration(s) of etchant(s), flow rate(s) of etchant(s), concentration ratio of etchant(s), bias voltage, a power of a radio frequency source, process pressure, process temperature, and etchant temperature) is tunable to achieve patterning of the spacer layer 11 and the bottom electrode via layer 6. Each of the MTJ elements 7' includes two peripheral regions 71 beneath a corresponding one of the spacers 11', and a main region 72 beneath a corresponding one of the top electrodes 81. The spacers 11' offer protection to the MTJ elements 7' against possible corrosion or/and diffusion of materials from components within/other than those in the magnetic memory device 200 shown in FIGS. 18A and 18B.

Figure 17A:
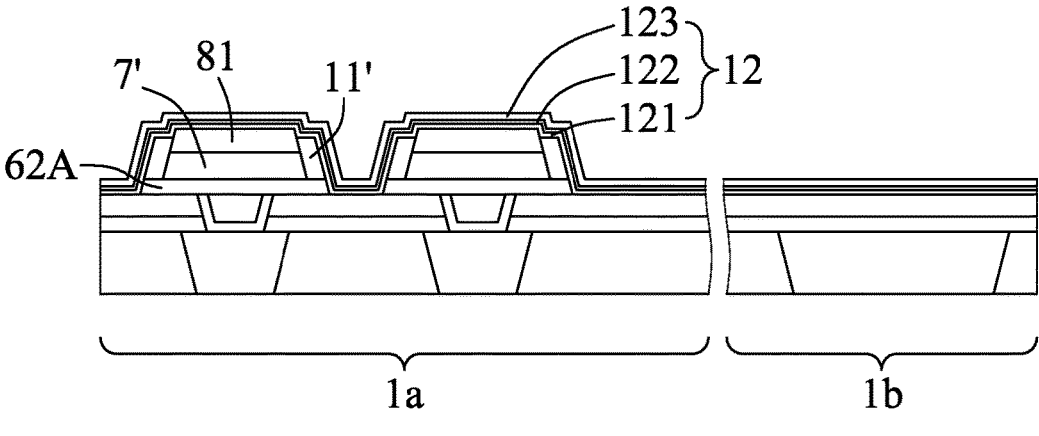
Figure 17B:
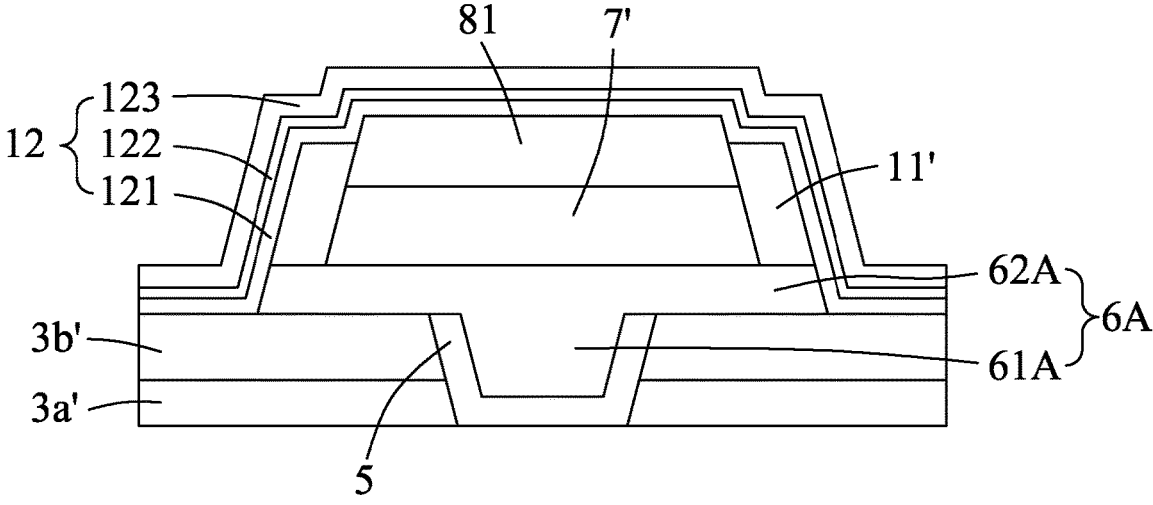

Referring to FIG. 1B, the examples illustrated in FIGS. 17A and 17B, the method 100 proceeds to step 114, where a shielding layer 12 is formed conformally over the structure shown in FIG. 16. FIG. 17B is a fragmentary enlarged view of FIG. 17A in accordance with some embodiments. In some embodiments, the shielding layer 12 includes an inner dielectric film 121 that covers the MTJ unit 7A, a magnetic film 122 on the inner dielectric film 121, and an outer dielectric film 123 on the magnetic film 122 opposite to the inner dielectric film 121. The shielding layer 12 may be formed by, for example, but not limited to, CVD, PVD (e.g., sputtering), ALD, or combinations thereof. Other suitable techniques for forming the shielding layer 12 are within the contemplated scope of the present disclosure. In some embodiments, each of the inner dielectric film 121, the magnetic film 122, and the outer dielectric film 123 is formed by, for example, but not limited to, CVD, PVD, ALD, or combinations thereof. In certain embodiments, the inner dielectric film 121, the magnetic film 122, and the outer dielectric film 123 are formed by different deposition techniques. Other suitable techniques for forming the inner dielectric film 121, the magnetic film 122, and the outer dielectric film 123 are within the contemplated scope of the present disclosure. The inner dielectric film 121 may be made of a material including, for example, but not limited to, silicon oxide, silicon nitride, or the like, or combinations thereof. The magnetic film 122 may include a soft magnetic material, for example, but not limited to, cobalt zirconium tantalum (CoZrTa). The outer dielectric film 123 may be made of a material including, for example, but not limited to, silicon oxide, silicon nitride, or the like, or combinations thereof. The inner dielectric film 121 and the outer dielectric film 123 may be made of the same material or different materials. Other suitable materials for the shielding layer 12 (that is, in certain embodiments, the inner dielectric film 121, the magnetic film 122, and the outer dielectric film 123) are within the contemplated scope of the present disclosure. In certain embodiments, the inner dielectric film 121 may have a thickness ranging from about 20 Å to about 150 Å. The magnetic film 122 may have a thickness ranging from about 50 Å to about 500 Å. The outer dielectric film 123 may have a thickness ranging from about 50 Å to about 300 Å.

Figure 17C:
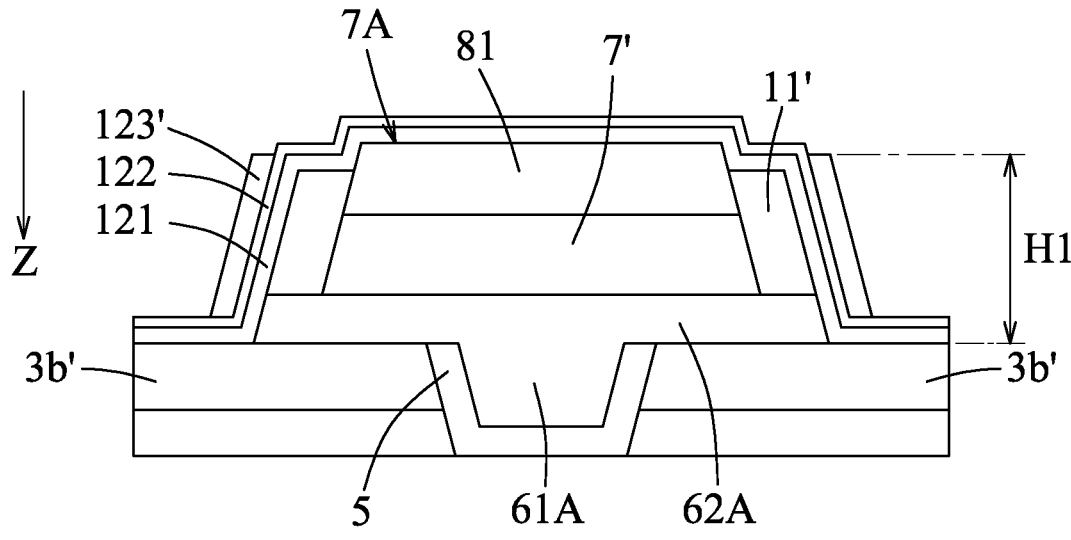

Referring to FIG. 1B and the example illustrated in FIG. 17C, the method 100 proceeds to step 115, where the outer dielectric film 123 shown in FIG. 17B is partially removed to expose the magnetic film 122 and to form the outer dielectric film 123 into outer dielectric layers 123'. FIG. 17C illustrates a structure subsequent to the structure shown in FIG. 17B. Each of the outer dielectric layers 123' are formed to surround a corresponding one of the MTJ units 7A. The outer dielectric film 123 may be partially removed by using an etching process, for example, a dry etching process (e.g. an RIE process, etc.) or an IBE process, but not limited thereto. The magnetic film 122 may serve as an etch stop layer for the etching process. The ion-beam etching process implements charged particles (e.g., ions) to collide with the outer dielectric film 123, which results in removal of a part of the outer dielectric film 123 having a thickness which is insufficient to withstand the collision of the charged particles (e.g., ions) in a particular direction (i.e., a Z direction). As such, the etching process is controlled according to application requirements so that the magnetic film 122 can be exposed and that each of the outer dielectric layers 123' has a top surface having a desired surface height with respect to the top surfaces of the second dielectric sublayers 3b'. In some embodiments, the top surfaces of the outer dielectric layers 123' have a surface height (H1) higher than that of top surfaces of the MTJ elements 7' in the MTJ units 7A with respect to the top surfaces of the second dielectric sub-layers 3b'. In some embodiments, the etching process may use an etch gas such as a nitrogen-containing etch gas (e.g., $NH_3$), a halogen-containing etch gas (for example, a chlorine-containing etch gas such as $Cl_2$, $SiCl_4$, $BCl_3$, $CHCl_3$, $CCl_4$, or the like, a fluorine-containing etch gas such as $F_2$, $NF_3$, $C_xF_y$, $CH_xF_y$, HF, $SF_6$, or the like), a hydrogen-containing etch gas (e.g., $H_2$), or the like, or combinations thereof, but not limited thereto. The etching process may use a carrier gas to deliver the etch gas. In certain embodiments, the etching process may be a timed process so that etching is stopped after a period of time when a desired part of the outer dielectric film 123 is removed. Before the etching process, a photoresist (not shown) may be developed using a lithography process. Parameter(s) of the etching process (e.g., concentration(s) of etchant(s), flow rate(s) of etchant (s), concentration ratio of etchant(s), bias voltage, a power of a radio frequency source, process pressure, process temperature, and etchant temperature) is tunable to achieve partial removal of the outer dielectric film 123. Other processes suitable for partial removal of the outer dielectric film 123 are within the contemplated scope of the present disclosure.

Figure 17D:
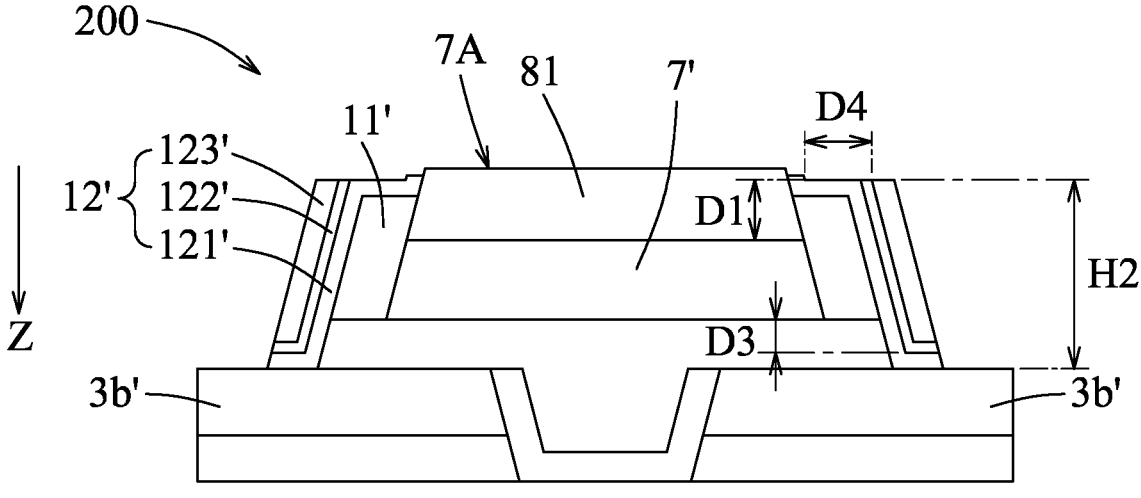

Referring to FIG. 1B and the example illustrated in FIG. 17D, the method 100 proceeds to step 116, where the magnetic film 122 and the inner dielectric film 121 are partially removed to form magnetic layers 122' and the inner dielectric layers 121' and to expose the top electrode 81 of each of the MTJ units 7A (see also FIG. 18). FIG. 17D illustrates a structure subsequent to the structure shown in FIG. 17C. Partial removal of the magnetic film 122 and the inner dielectric film 121 may be performed using any suitable etching process, for example, but not limited to, a dry etching process (e.g., an RIE process, etc.), an IBE process, or the like. In some embodiments, the step 116 includes the following sub-steps: (i) etching the magnetic film 122 to expose the inner dielectric film 121 and to form the magnetic film 122 into the magnetic layers 122', and (ii) etching the inner dielectric film 121 to expose the top electrode 81 of each of the MTJ units 7A and to form the inner dielectric layers 121'. Etching of the magnetic film 122 and the inner dielectric film 121 using ion-beam etching results in removal of a part of the magnetic film 122 and a part of the inner dielectric film 121 having a thickness which is insufficient to withstand the collision of the charged particles (e.g., ions) in a particular direction (i.e., the Z direction). As such, the etching process is controlled according to application requirements so that the top electrode 81 of each of the MTJ units 7A can be exposed and that each of the magnetic layers 122' has a top surface having a desired surface height with respect to the top surfaces of the second dielectric sublayers 3b'. In some embodiments, the upper surfaces of the magnetic layers 122' have a surface height (H2) higher than that of top surfaces of the MTJ elements 7' in the MTJ units 7A with respect to the top surfaces of the second dielectric sub-layers 3b'. In some embodiments, the etching process may be similar to those described in step 115, but parameter(s) of the etching process (e.g., concentration(s) of etchant(s), flow rate(s) of etchant(s), concentration ratio of etchant(s), bias voltage, a power of a radio frequency source, process pressure, process temperature, and etchant temperature) is tunable to achieve partial removal of the magnetic film 122 and the inner dielectric film 121. In certain embodiments, the etching process may be a timed process so that etching is stopped after a period of time when desired parts of the magnetic film 122 and the inner dielectric film 121 are removed. Partial removal of the magnetic film 122 and the inner dielectric film 121 may include multiple etching processes so that the magnetic layers 122' and the inner dielectric layers 121' are formed according to application requirements. Other processes suitable for partial removal of the magnetic film 122 and the inner dielectric film 121 are within the contemplated scope of the present disclosure. After the etching process, a cleaning process, for example, but not limited to, a wet clean process, may be performed. The wet clean process may include using, for example, but not limited to, diluted HF. Other suitable cleaning processes are within the contemplated scope of the present disclosure. After step 116, (i) the shielding layer 12 formed in step 114 and shown in FIG. 17A is patterned into a plurality of shielding elements 12' (see also FIG. 18), each including one of the inner dielectric layers 121', a corresponding one of the magnetic layers 122', and a corresponding one of the outer dielectric layers 123', and (ii) magnetic memory devices 200 (see also FIG. 18), each including one of the MTJ units 7A and a corresponding one of the shielding elements 12', is obtained. In certain embodiments, the magnetic layer 122' has a thickness that ranges from about 50 Å to about 500 Å.

Referring to FIG. 1B and the examples illustrated in FIGS. 18A and 18B, the method 100 proceeds to step 117, where the shielding elements 12' are etched back to adjust the height of the magnetic layers 122'. FIG. 18B is a fragmentary enlarged view of FIG. 18A in accordance with some embodiments and illustrates a structure subsequent to the structure shown in FIG. 17D. Step 117 may be performed in a manner similar to the etching process described in step 115, but parameter(s) of the etching process (e.g., concentration(s) of etchant(s), flow rate(s) of etchant(s), concentration ratio of etchant(s), bias voltage, a power of a radio frequency source, process pressure, process temperature, and etchant temperature) is tunable to achieve the etching back of the shielding elements 12'. In some embodiments, in each of the MTJ units 7A, (i) the magnetic layer 122' has an upper surface higher than a top surface of MTJ element 7' by a first predetermined distance (D1 shown in FIG. 17D or D2 shown in FIG. 18B), (ii) the magnetic layer 122' has a lower surface lower than a bottom surface of the MTJ element 7' by a second predetermined distance (D3 shown in FIG. 17D or FIG. 18B), and (iii) the magnetic layer 122' is spaced apart from the MTJ element 7' by a third predetermined distance (D4 shown in FIG. 17D or FIG. 18B), so as to deviate an external magnetic field away from the MTJ element 7'. In some embodiments, step 117 may be omitted.

As shown in FIG. 18B, the MTJ element 7' of each of the MTJ unit 7A includes the reference layer 701, the tunnel barrier layer 702, the free layer 703, the maintenance layer 704, and the buffer layer 705. Although, in FIG. 18B, the MTJ element 7' includes, from bottom to top, the reference layer 701, the tunnel barrier layer 702, the free layer 703, the maintenance layer 704, and the buffer layer 705, in other embodiments, the MTJ element 7' may include, from bottom to top, the maintenance layer 704, the free layer 703, the tunnel barrier layer 702, the reference film 701, and the buffer film 705. In some other embodiments, the maintenance layer 704 and the buffer layer 705 are omitted.

In some embodiments, the inner dielectric layer 121' and the outer dielectric layer 123' may also function as a spacer in each of the MTJ units 7A, and thus, the spacer 11' may be omitted.

Referring to FIG. 1B and the example illustrated in FIG. 19, the method 100 proceeds to step 118, where a third dielectric layer 13 is formed to cover the structure shown in FIG. 18A, and contact vias 14a, 14b are formed in the third dielectric layer 13.

The third dielectric layer 13 may be formed by a deposition process, for example, but not limited to, CVD, PVD, followed by removing an excess of the third dielectric layer 13 by a planarization process, such as CMP, or other suitable planarization processes. Other processes suitable for forming the third dielectric layer 13 are within the contemplated scope of the present disclosure. Materials suitable for the third dielectric layer 13 may be similar to those for the first dielectric layer 1, and thus, the details thereof are omitted for the sake of brevity. Other materials suitable of the third dielectric layer 13 are within the contemplated scope of the present disclosure.

Formation of the contact vias 14a, 14b may include the following sub-steps: (i) patterning the third dielectric layer 13 to form second and third trenches (not shown) respectively on the device memory and device peripheral regions 1a, 1b, (ii) depositing a contact metal material on the third dielectric layer 13 to fill the second and third trenches, and (iii) removing an excess of the contact metal material on the third dielectric layer 13. Each of the second trenches penetrates the third dielectric layer 13 to expose a corresponding one of the top electrodes 81 of the MTJ units 7A on the device memory region 1a, thereby forming the contact vias 14a in the second trenches and forming the contact via 14b in the third trench. The third trench penetrates the third dielectric layer 13 to expose a corresponding one of the first metal lines 2 on the device peripheral region 1b. In some embodiments, deposition of the contact metal material may be implemented using, for example, CVD, PVD, electroless plating, electroplating, or other suitable deposition techniques. In some embodiments, the contact vias 14a, 14b may include, but not limited to, copper, aluminum, tungsten, or combinations thereof. Other materials suitable for the contact vias 14a, 14b are within the contemplated scope of the present disclosure. In some embodiments, removal of the excess of the contact metal material may be implemented using, for example, but limited to, CMP, or other suitable planarization techniques. The contact vias 14a filling the second trenches are electrically and respectively connected to the top electrodes 81 of the MTJ units 7A on the device memory region 1a. The contact via 14b filling the third trench is electrically and directly connected to the corresponding one of the first metal lines 2 on the device peripheral region 1b.

In some embodiments, prior to forming the third dielectric layer 13, a second etch stop layer (not shown) may be disposed to cover the structure shown in FIG. 18A, and a buffer layer (not shown) may be disposed on the second etch stop layer. The third dielectric layer 13 is then formed on the buffer layer, and the contact vias 14a, 14b penetrate the third dielectric layer 13, the buffer layer, the second etch stop layer to be respectively in contact with the top electrodes 81 on the device memory region 1a and the first metal line 2 on the device peripheral region 1b. After step 118, the semiconductor structure 300 is obtained.

Referring to FIG. 1B and the example illustrated in FIG. 19, the method 100 proceeds to step 119, where a fourth dielectric layer 16 is formed over the third dielectric layer 13 and the contact vias 14a, 14b, and second and third metal lines 17a, 17b are formed in the fourth dielectric layer 16 such that the second and third metal lines 17a, 17b are respectively in electrical contact with the contact vias 14a, 14b. In some embodiments, the materials suitable for the fourth dielectric layer 16 may be similar to those for the first dielectric layer 1, and the details thereof are omitted for the sake of brevity. In some embodiments, formation of the fourth dielectric layer 16 is similar to that of the first dielectric layer 1, and details thereof are omitted for the sake of brevity. Other materials and processes suitable for forming the fourth dielectric layer 16 are within the contemplated scope of the present disclosure. Formation of the second and third metal lines 17a, 17b is similar to that of the first metal lines 2, and details thereof are omitted for the sake of brevity. The materials suitable for the second and third metal lines 17a, 17b are similar to those for the first metal lines 2, and details thereof are omitted for the sake of brevity. Other materials and processes suitable for forming the second and third metal lines 17a, 17b are within the contemplated scope of the present disclosure. The top electrodes 81 of the MTJ units 7A are respectively electrically coupled to the second metal lines 17a, and the bottom electrode 62A of the MTJ units 7A are respectively electrically coupled to the first metal lines 2 on the device memory region 1a. Hence, each of the magnetic memory devices 200 can be connected to a peripheral circuit(s) or other suitable devices.

In alternative embodiments, other suitable methods may also be applied for forming the semiconductor structure 300. In yet alternative embodiments, additional features may be added in the semiconductor structure 300, and some features in the semiconductor structure 300 may be modified, replaced, or eliminated without departure from the spirit and scope of the present disclosure.

Figure 21:
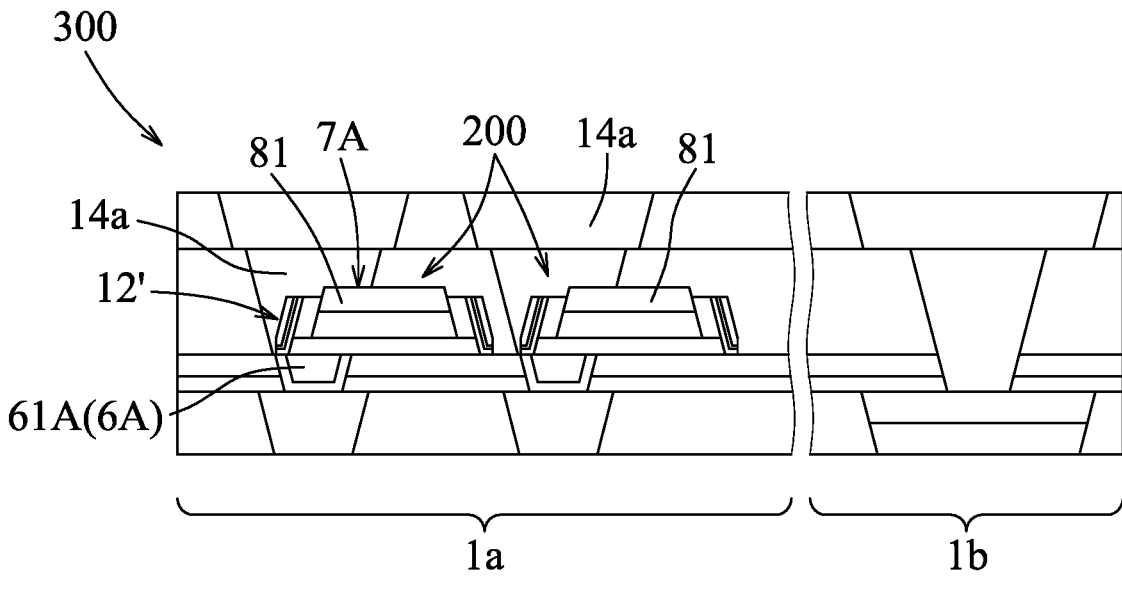
FIG. 21 is a schematic view of the semiconductor structure in accordance with some embodiments of the present disclosure.

FIG. 21 illustrates a fragmentary enlarged schematic view of the magnetic memory device 200 in accordance with some embodiments of the present disclosure. The magnetic memory device 200 includes the MTJ unit 7A and the shielding element 12'. The MTJ unit 7A includes the bottom electrode 62A, the MTJ layer 7' MTJ element 7' disposed on the bottom electrode 62A, and the top electrode 81 disposed on the MTJ element 7'. The shielding element 12' is disposed on the MTJ unit 7A to deviate a magnetic field away from the MTJ element 7'. In certain embodiments, the shielding element 12' is disposed to surround the MTJ element 7', and includes the magnetic layer 122' including a soft magnetic material. In some embodiments, the shielding element 12' further includes the inner dielectric layer 121' disposed between the MTJ unit 7A and the magnetic layer 122', and the outer dielectric layer 123' disposed on the magnetic layer 122' opposite to the inner dielectric layer 121'. In certain embodiments, the magnetic layer 122' has a thickness that ranges from about 50 Å to about 500 Å. The MTJ unit 7A may further include the spacer 11' disposed to cover the outer periphery of the MTJ element 7' exposed from the top electrode 81 and the bottom electrode 62A. The MTJ element 7' may further include the reference layer having a fixed magnetic orientation, the tunnel barrier element disposed on the reference layer and including an insulating material, and the free layer having a changeable magnetic orientation and disposed to permit the tunnel barrier element to be sandwiched between the reference layer and the free layer.

Figure 20:
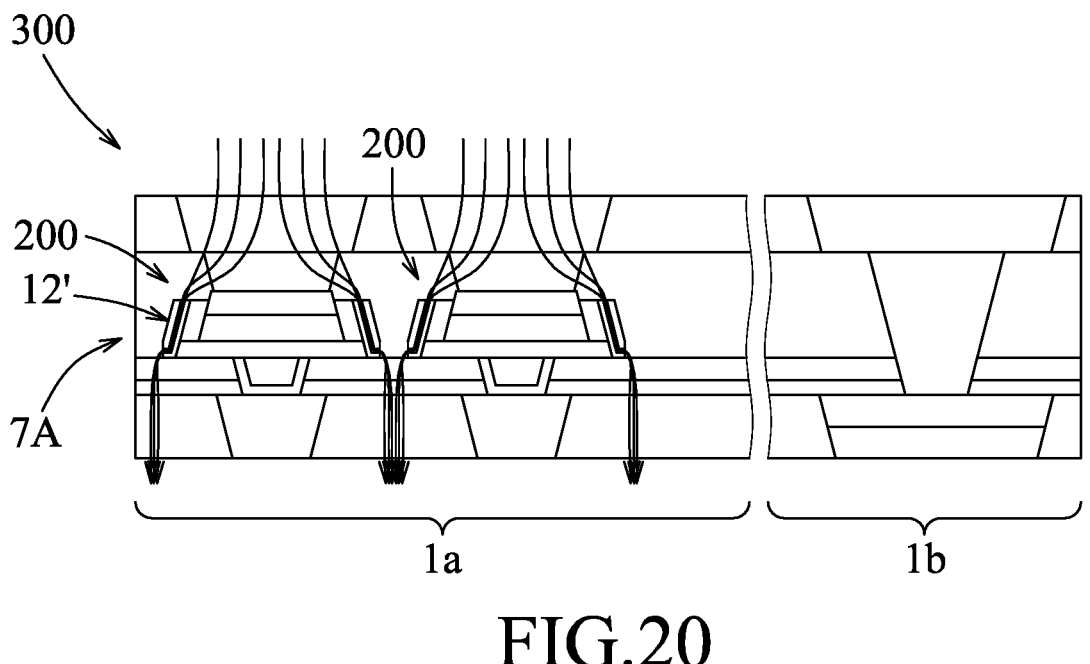
FIG. 20 is a schematic view of magnetic fields passing through the semiconductor structure in accordance with some embodiments of the present disclosure.

FIG. 20 is a fragmentary enlarged schematic view similar to that of FIG. 19 but illustrating external magnetic fields entering the magnetic memory devices 200 in accordance with some embodiments of the present disclosure. As shown in FIG. 20, the external magnetic fields (i.e., magnetic lines of force) selectively pass through the shielding elements 12' instead of passing through the MTJ element 7', and thus, the shielding elements 12' of the magnetic memory devices 200 can effectively reduce the effect of external magnetic fields (e.g., external magnetic turbulence) on the MTJ elements 7', and thereby improve magnetic coercivity ($H_C$) and reduce reflow bit error rate of the magnetic memory devices 200, which enhances stability and durability of the magnetic memory devices 200.

Referring to the example illustrated in FIG. 21, another embodiment of the magnetic memory devices 200 according to the present disclosure is provided in the semiconductor structure 300. In FIG. 21, the MTJ units 7A are located slightly offset. For example, the contact vias 14 are not in full contact with upper surfaces of the top electrodes 81 of the magnetic memory devices 200, respectively. As shown in FIG. 21, by adding the shielding elements 12' to the MTJ units 7A, there is greater possibility that direct connection between the contact vias 14a and the bottom electrode vias 61A of the bottom electrode segments 6A can be avoided because of the shielding elements 12' surrounding the MTJ units 7A being located between the contact vias 14a and the bottom electrode vias 61A of the bottom electrode segments 6A when the MTJ units 7A have a slight displacement in the semiconductor structure 300. Hence, short-circuiting of device including the magnetic memory device 200 can be avoided and stability of the device can be increased.

Figure 22A:
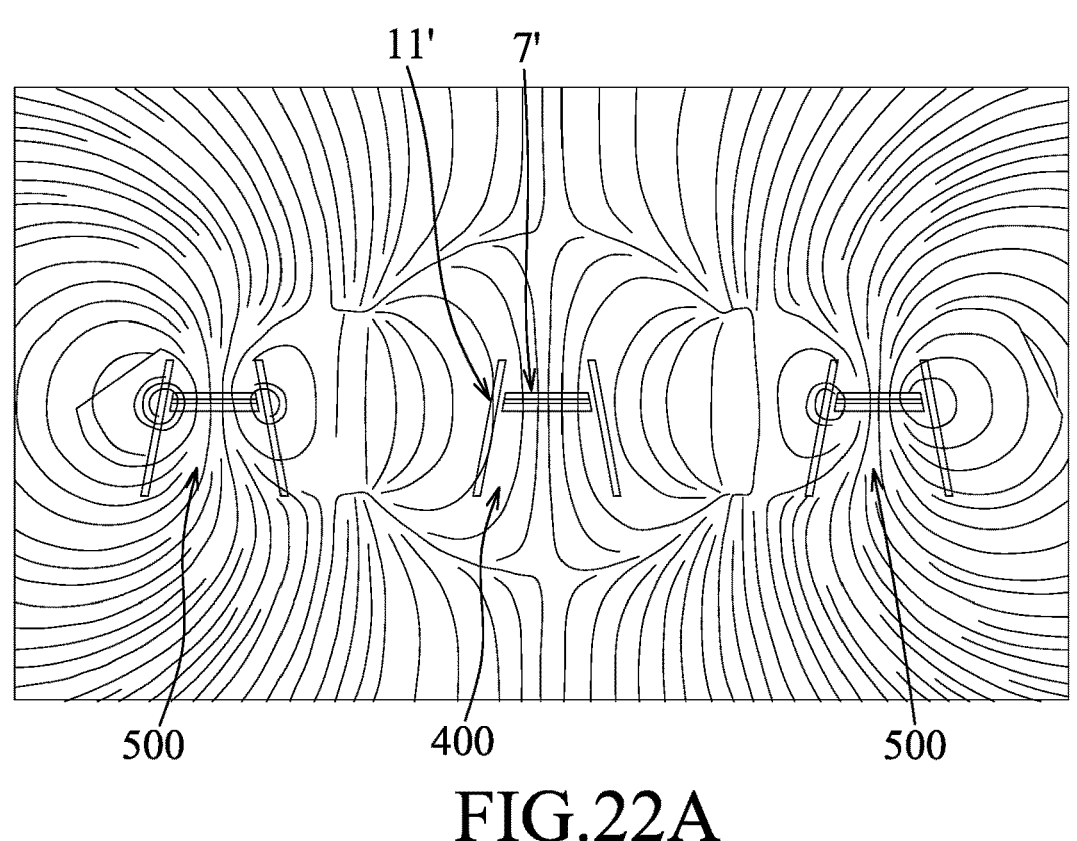
FIGS. 22A and 22B are magnetic field simulation graphs illustrating magnetic fields passing through magnetic memory devices in accordance with some embodiments of the present disclosure.
Figure 22B:
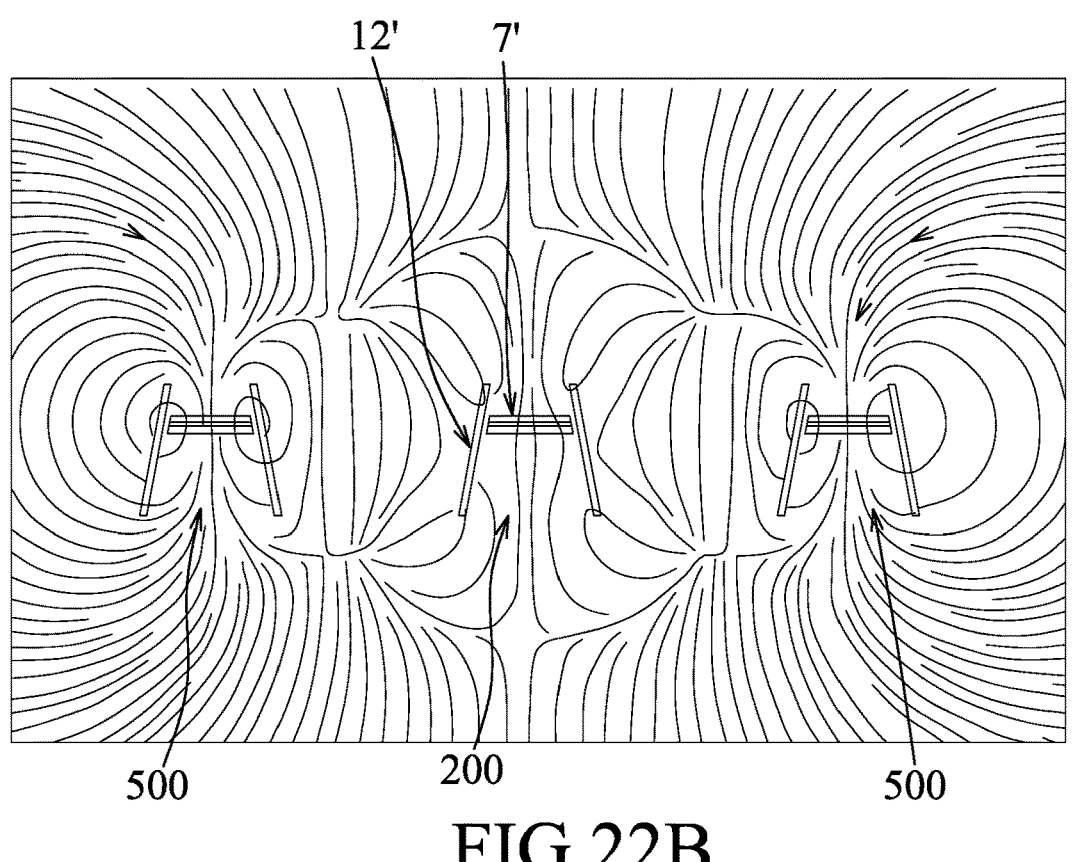

FIGS. 22A and 22B are schematic views respectively illustrating a simulation of magnetic fields passing through a sample memory device 400 and a simulation of magnetic fields passing through the magnetic memory device 200 according to some embodiments of the present disclosure. The sample memory device 400 has a configuration similar to that of the magnetic memory device 200 but without the shielding element 12'. In other words, the sample memory device 400 includes the MTJ unit 7A (only the MTJ element 7' and the spacer 11' of the MTJ unit 7A are shown in FIG. 22A), while the magnetic memory device 200 includes the MTJ unit 7A (only the MTJ element 7' of the MTJ unit 7A is shown in FIG. 22B) and the shielding element 12'. Two additional magnetic memory devices 500, each of which may have a configuration similar to that of the magnetic memory devices 200, are placed on a side of each of the sample memory device 400 (see FIG. 22A) and the magnetic memory device 200 (see FIG. 22B). To simplify the simulation, the magnetic fields are assumed to be generated only by the additional magnetic memory devices 500. The magnetic fields generated by the additional magnetic memory devices 500 are presented as magnetic lines of force in FIGS. 22A and 22B. The simulations are conducted to observe and compare the magnetic fields passing through the sample memory device 400 and the magnetic memory device 200 of the present disclosure. Comparing the simulation result in FIG. 22A with the simulation result in FIG. 22B, it can be seen that magnetic fields can be deviated away from the MTJ element 7' by the shielding elements 12'. That is, part of the magnetic fields passing through the MTJ element 7' in FIG. 22A is deviated to pass through shielding element 12', rather than passing through the MTJ element 7', as shown in FIG. 22B. Hence, the shielding element 12' can provide protection to the MTJ element 7' of the MTJ unit 7A against external magnetic fields (e.g., magnetic fields generated by additional magnetic memory device(s) 500 or/and other external magnetic fields).

Figure 23:
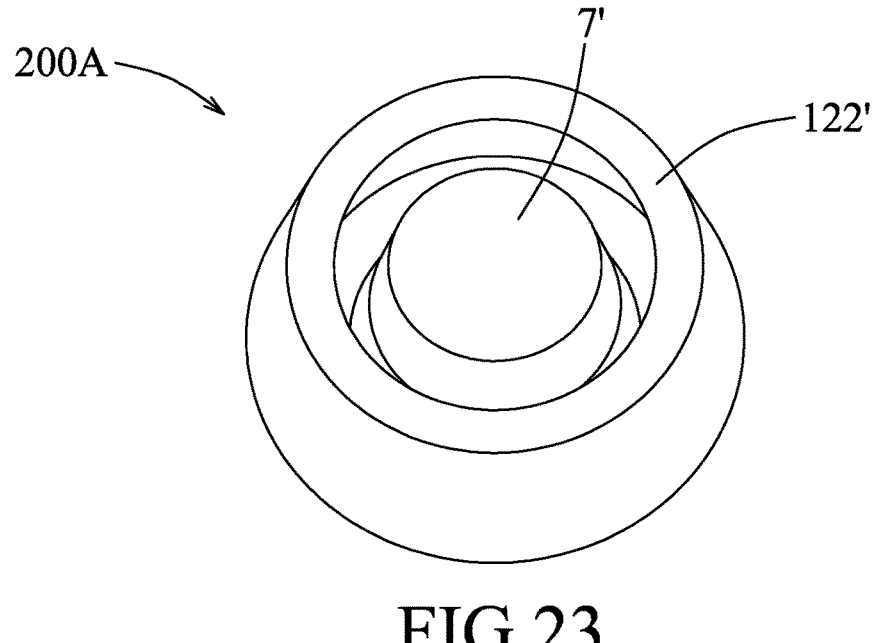
FIG. 23 is a perspective view of a simulation device for simulating the magnetic memory device in accordance with some embodiments of the present disclosure.

FIG. 23 is a schematic view illustrating a simulation device 200A for simulating the magnetic memory device 200 according to some embodiments of the present disclosure. To simplify the simulation, the MTJ element 7' and the magnetic layer 122' are provided in the simulation device 200A for simulating the effect of the magnetic layer 122' to the MTJ element 7'.

Figure 24:
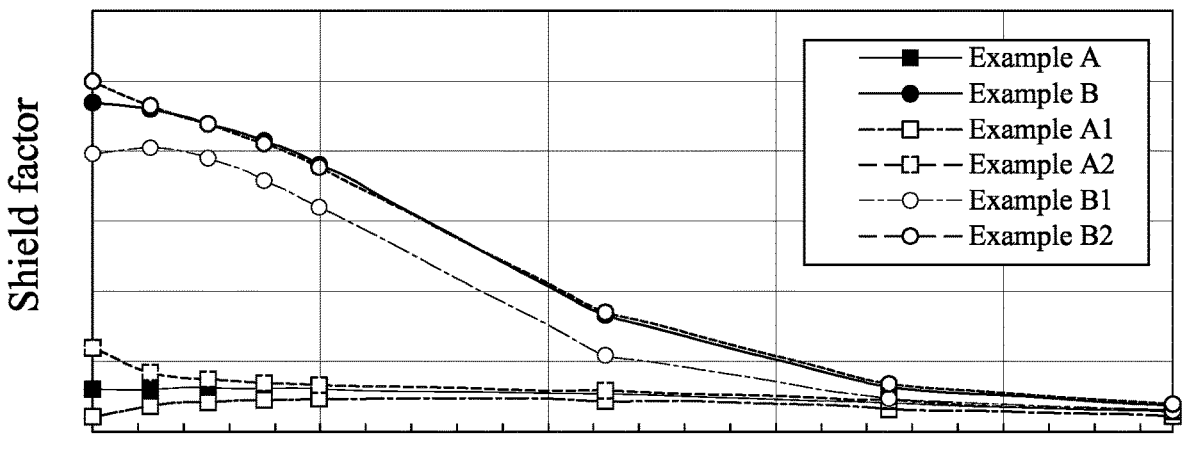
FIG. 24 is a line graph illustrating a relationship of a shield factor and an amount of external magnetic field for each of examples in accordance with some embodiments of the present disclosure.

FIG. 24 is a graph illustrating a relationship of a shield factor and an amount of external magnetic field ($H_{ext}$) for each of Examples A, A1, A2, B, B1, and B2. A simulation device of Example A has a configuration similar to that of the simulation device 200A shown in FIG. 23, in which a surface height of the upper surface of the magnetic layer 122' is substantially the same as that of the top surface of the MTJ element 7', and the surface height of a bottom surface of the magnetic layer 122' is substantially the same as that of a bottom surface of the MTJ element 7'. A simulation device of Example B is similar to that of Example A, but the surface height of the upper surface of the magnetic layer 122' is higher than that of the top surface of the MTJ element 7', and the surface height of a bottom surface of the magnetic layer 122' is lower than that of a bottom surface of the MTJ element 7'. A shield factor for each sample is calculated by a ratio of an amount of $H_{ext}$ deviated by the magnetic layer 122' to an amount of $H_{ext}$ acting on the MTJ element 7' (i.e., the total amount of $H_{ext}$ acting on the simulation device 200A minus the amount of $H_{ext}$ deviated by the magnetic layer 122'). Generally, the results in FIG. 24 show that when an external magnetic field is applied to the simulation device of each of Examples A and B, the simulation device of Example B has a greater shield factor than that of Example A, indicating that simulation device of Example B can offer better protection to the MTJ element 7' against external magnetic turbulence than that of Example A. Hence, it can be inferred from these results that the magnetic layer 122' can deviate magnetic field from the MTJ element 7' effectively when the surface height of the upper surface of the magnetic layer 122' is higher than the surface height of the top surface of the MTJ element 7', especially when the amount of $H_{ext}$ acting on the simulation device is not great.

In each of Examples A1 and A2, a plurality of the simulation devices of Example A are used for simulating crosstalk among the simulation devices (see also FIGS. 22A and 22B). In each of Examples B1 and B2, a plurality of the simulation devices of Example B are used for simulating crosstalk among the simulation devices. The crosstalk occurs due to the MTJ elements 7' of the simulation devices in each of Examples A1, A2, B1, and B2 generating their own magnetic fields.

When the direction of $H_{ext}$ acting on one of the simulation devices is substantially the same as that of crosstalk acting on the one of simulation devices (for example, in Examples A1 and B1), the shielding effect (i.e., the shield factor) offered by the magnetic layer 122' to the one of the simulation devices may be reduced due to increase in magnetic field in one direction (i.e., a combination of $H_{ext}$ and the magnetic field from crosstalk in one direction). Moreover, when direction of $H_{ext}$ acting on the one of the simulation devices is substantially opposite to that of crosstalk acting on the one of the simulation devices (for example, in Examples A2 and B2), the shielding effect offered by the magnetic layer 122' may slightly increase due to decrease in magnetic field in one direction (i.e., some amount of $H_{ext}$ is canceled out by the magnetic field from crosstalk). Moreover, the MTJ element 7' may include layers of magnetic material, and thus, each of the layers of magnetic material generates a magnetic field. The magnetic fields generated by the layers of magnetic material creates an offset magnetic field which contributes to the crosstalk among the simulation devices (or the magnetic memory devices 200). Therefore, the offset magnetic field is to be controlled to achieve minimum crosstalk among the simulation devices (or the magnetic memory devices 200) in order to mitigate external magnetic field disturbance on the MTJ element 7'.

The results in FIG. 24 show that when the direction of $H_{ext}$ acting on the one of the simulation devices of Example A1 is substantially the same to that of crosstalk acting on the one of the simulation devices, the shield factor of the one of the simulation devices in Example A1 is lower than that when no crosstalk is present (i.e., Example A). Similarly, when the direction of $H_{ext}$ acting on the one of the simulation devices of Example B1 is substantially the same to that of crosstalk acting on the one of the simulation devices, the shield factor of the one of the simulation devices in Example B1 is lower than that when no crosstalk is present (i.e., Example B). Also, when the direction of $H_{ext}$ acting on the one of the simulation devices of Example A2 is opposite to that of crosstalk acting on the one of the simulation devices of Example A2, the shield factor of the one of the simulation devices in Example A2 is slightly larger than that when no crosstalk is present (i.e., Example A). Similarly, when the direction of $H_{ext}$ acting on the one of the simulation devices of Example B2 is opposite to that of crosstalk acting on the one of the simulation devices of Example B2, the shield factor of the one of the simulation devices in Example B2 is slightly larger than that when no crosstalk is present (i.e., Example B). It can be inferred from the results in FIG. 24 that crosstalk among multiple ones of the magnetic memory device (for example, the magnetic memory devices 200 shown in FIG. 19) may degrade the shield factor of the magnetic layer 122', and thus, the direction of crosstalk among multiple ones of magnetic memory device is a factor to be considered according to application requirements in order to maximize the shield factor of the magnetic layer 122'.

The embodiments of the present disclosure have the following advantageous features. By including the shielding element(s) in the magnetic memory device of the present disclosure, the shielding element(s) can effectively reduce the effect of external magnetic fields (e.g., external magnetic turbulence, crosstalk from adjacent magnetic devices) on the MTJ element(s) of the MTJ unit(s) in the magnetic memory device, and thereby improving magnetic coercivity and reducing reflow bit error rate of the magnetic memory device, which enhances stability and durability of the magnetic memory device. In addition, short-circuiting of device including the magnetic memory device can be avoided due to greater possibility that direct connection between the contact vias and the bottom electrode via can be avoided because of the shielding elements surrounding the MTJ units being located between the contact vias and the bottom electrode via when the MTJ units have a slight displacement in the semiconductor structure.

In accordance with some embodiments of the present disclosure, a memory device includes a memory unit and a shielding element. The memory unit includes a bottom electrode, a memory element disposed on the bottom electrode, and a top electrode disposed on the memory element. The shielding element is disposed on the memory unit to deviate an external magnetic field away from the memory element.

In accordance with some embodiments of the present disclosure, the memory unit is a magnetic tunnel junction (MTJ) unit, and the memory element is an MTJ element.

In accordance with some embodiments of the present disclosure, the shielding element is disposed to surround the MTJ element, and includes a magnetic layer including a soft magnetic material.

In accordance with some embodiments of the present disclosure, the magnetic layer has an upper surface and a lower surface which are distal from and proximate to a lower surface of the bottom electrode, respectively. The MTJ element has an upper surface and a lower surface which are distal from and proximate to the lower surface of the bottom electrode, respectively. The upper surface of the magnetic layer has a surface height greater than a surface height of the upper surface of the MTJ element with respect to the lower surface of the bottom electrode. The lower surface of the magnetic layer has a surface height lower than a surface height of the lower surface of the MTJ element with respect to the lower surface of the bottom electrode.

In accordance with some embodiments of the present disclosure, the shielding element further includes an inner dielectric layer disposed between the MTJ unit and the magnetic layer, and an outer dielectric layer disposed on the magnetic layer opposite to the inner dielectric layer.

In accordance with some embodiments of the present disclosure, the inner dielectric layer includes a dielectric material including oxygen, nitrogen, or a combination thereof.

In accordance with some embodiments of the present disclosure, the magnetic layer has a thickness that ranges from 50 Å to 500 Å.

In accordance with some embodiments of the present disclosure, the soft magnetic material includes cobalt, tantalum, zirconium, copper, or combinations thereof.

In accordance with some embodiments of the present disclosure, the MTJ unit further includes a spacer disposed to cover an outer periphery of the MTJ element exposed from the top electrode and the bottom electrode.

In accordance with some embodiments of the present disclosure, the MTJ element includes a reference layer, a tunnel barrier layer, and a free layer. The reference layer has a fixed magnetic orientation. The tunnel barrier layer is disposed on the reference layer and includes an insulating material. The free layer has a changeable magnetic orientation, and is disposed to permit the tunnel barrier layer to be sandwiched between the reference layer and the free layer.

In accordance with some embodiments of the present disclosure, a method for manufacturing a magnetic memory device includes: forming a magnetic tunnel junction (MTJ) unit; and forming a shielding element which is disposed on the MTJ unit, and which includes a magnetic layer.

In accordance with some embodiments of the present disclosure, forming the MTJ unit includes: forming an MTJ element on a bottom electrode; and forming a top electrode on the MTJ element.

In accordance with some embodiments of the present disclosure, the MTJ element includes a reference layer having a fixed magnetic orientation, a free layer having a changeable magnetic orientation, and a tunnel barrier layer including an insulating material and disposed between the reference layer and the free layer.

In accordance with some embodiments of the present disclosure, forming the MTJ unit further includes: forming a spacer to cover an outer periphery of the MTJ element exposed from the top electrode and the bottom electrode.

In accordance with some embodiments of the present disclosure, forming the shielding element includes: forming an inner dielectric layer surrounding the MTJ unit; forming the magnetic layer on the inner dielectric layer, the magnetic layer including a soft magnetic material; and forming an outer dielectric layer on the magnetic layer opposite to the inner dielectric layer.

In accordance with some embodiments of the present disclosure, the magnetic layer has a thickness that ranges from 50 Å to 500 Å.

In accordance with some embodiments of the present disclosure, a method for manufacturing a magnetic memory device includes: forming an MTJ unit which includes a top electrode, a bottom electrode, an MTJ element sandwiched between the top and bottom electrode, and a spacer disposed to cover an outer periphery of the MTJ element exposed from the top and bottom electrodes; forming a shielding layer to cover the MTJ unit; and patterning the shielding layer to expose the top electrode and to form a shielding element that surrounds and covers the bottom electrode and the spacer.

In accordance with some embodiments of the present disclosure, forming the shielding layer includes: forming an inner dielectric film that covers the MTJ unit; forming the magnetic film on the inner dielectric film, the magnetic film including a soft magnetic material; and forming an outer dielectric film on the magnetic film opposite to the inner dielectric film.

In accordance with some embodiments of the present disclosure, patterning the shielding layer includes: patterning the outer dielectric film to form an outer dielectric layer which surrounds the MTJ unit; patterning the magnetic film to form a magnetic layer which surrounds the MTJ unit; and patterning the inner dielectric film to expose the top electrode and to form an inner dielectric layer which is disposed between the magnetic layer and the spacer and which surrounds the MTJ unit.

In accordance with some embodiments of the present disclosure, the soft magnetic material includes cobalt, tantalum, zirconium, copper, nickel, iron, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a magnetic memory device, comprising:
    forming a magnetic tunnel junction (MTJ) unit over a base structure, the MTJ unit having an upper surface opposite to the base structure; and
    forming a shielding element which is disposed on the MTJ unit and which exposes the upper surface of the MTJ unit to deviate an external magnetic field away from the MTJ unit, and which includes a magnetic layer.

2. The method of claim 1, wherein forming the MTJ unit includes: forming an MTJ element on a bottom electrode; and forming a top electrode on the MTJ element, the top electrode having the upper surface of the MTJ unit.

3. The method of claim 2, wherein the MTJ element includes:
    a reference layer having a fixed magnetic orientation;
    a free layer having a changeable magnetic orientation; and
    a tunnel barrier layer including an insulating material and disposed between the reference layer and the free layer.

4. The method of claim 2, wherein forming the MTJ unit further includes: forming a spacer to cover an outer periphery of the MTJ element exposed from the top electrode and the bottom electrode.

5. The method of claim 1, wherein forming the shielding element includes:
    forming an inner dielectric layer surrounding the MTJ unit;
    forming the magnetic layer on the inner dielectric layer, the magnetic layer including a soft magnetic material; and
    forming an outer dielectric layer on the magnetic layer opposite to the inner dielectric layer.

6. The method of claim 1, wherein the magnetic layer has a thickness that ranges from 50 Å to 500 Å.

7. A method for manufacturing a magnetic memory device, comprising:
    forming a magnetic tunnel junction (MTJ) unit which includes a top electrode, a bottom electrode, an MTJ element sandwiched between the top electrode and the bottom electrode, and a spacer disposed to cover an outer periphery of the MTJ element exposed from the top electrode and the bottom electrode;
    forming a shielding layer to cover the MTJ unit; and
    patterning the shielding layer to expose the top electrode and to form a shielding element that surrounds and covers the bottom electrode and the spacer.

8. The method of claim 7, wherein forming the shielding layer includes:
    forming an inner dielectric film that covers the MTJ unit;
    forming the magnetic film on the inner dielectric film, the magnetic film including a soft magnetic material; and
    forming an outer dielectric film on the magnetic film opposite to the inner dielectric film.

9. The method of claim 8, wherein patterning the shielding layer includes:
    patterning the outer dielectric film to form an outer dielectric layer which surrounds the MTJ unit;
    patterning the magnetic film to form a magnetic layer which surrounds the MTJ unit; and
    patterning the inner dielectric film to expose the top electrode and to form an inner dielectric layer which is disposed between the magnetic layer and the spacer and which surrounds the MTJ unit.

10. The method of claim 8, wherein the soft magnetic material includes cobalt, tantalum, zirconium, copper, nickel, iron, or combinations thereof.

11. A method for manufacturing a memory device, comprising:
    forming a memory unit including:
        a bottom electrode,
        a memory element disposed on the bottom electrode, and
        a top electrode disposed on the memory element; and
    forming a shielding element surrounding the memory unit to deviate an external magnetic field away from the memory element, the top electrode of the memory unit being exposed from the shielding element.

12. The method of claim 11, wherein the memory unit is a magnetic tunnel junction (MTJ) unit and the memory element is an MTJ element.

13. The method of claim 12, wherein the shielding element includes a magnetic layer including a soft magnetic material.

14. The method of claim 13, wherein:
    the magnetic layer has an upper surface and a lower surface which are distal from and proximate to a lower surface of the bottom electrode, respectively;
    the MTJ element has an upper surface and a lower surface which are distal from and proximate to the lower surface of the bottom electrode, respectively;
    the upper surface of the magnetic layer has a surface height greater than a surface height of the upper surface of the MTJ element with respect to the lower surface of the bottom electrode; and
    the lower surface of the magnetic layer has a surface height lower than a surface height of the lower surface of the MTJ element with respect to the lower surface of the bottom electrode.

15. The method of claim 13, wherein the shielding element further includes an inner dielectric layer disposed between the MTJ unit and the magnetic layer, and an outer dielectric layer disposed on the magnetic layer opposite to the inner dielectric layer.

16. The method of claim 15, wherein the inner dielectric layer includes a dielectric material including oxygen, nitrogen, or a combination thereof.

17. The method of claim 13, wherein the magnetic layer has a thickness that ranges from 50 Å to 500 Å.

18. The method of claim 13, wherein the soft magnetic material includes cobalt, tantalum, zirconium, copper, or combinations thereof.

19. The method of claim 12, wherein the MTJ unit further includes a spacer disposed to cover an outer periphery of the MTJ element exposed from the top electrode and the bottom electrode.

20. The method of claim 12, wherein the MTJ element includes:

a reference layer having a fixed magnetic orientation;

a tunnel barrier layer disposed on the reference layer, and including an insulating material; and a free layer having a changeable magnetic orientation, and disposed to permit the tunnel barrier layer to be sandwiched between the reference layer and the free layer.

* * * * *